US009786856B2

(12) United States Patent
O'Rourke et al.

(10) Patent No.: US 9,786,856 B2
(45) Date of Patent: Oct. 10, 2017

(54) METHOD OF MANUFACTURING AN IMAGE SENSOR DEVICE

(71) Applicant: DPIX, LLC, Colorado Springs, CO (US)

(72) Inventors: Shawn Michael O'Rourke, Colorado Springs, CO (US); Byung-Kyu Park, Colorado Springs, CO (US); Robert Rodriquez, Colorado Springs, CO (US)

(73) Assignee: dpiX, LLC, Colorado Springs, CO (US)

( * ) Notice: Subject to any disclaimer, the term of this patent is extended or adjusted under 35 U.S.C. 154(b) by 0 days.

(21) Appl. No.: 15/237,447

(22) Filed: Aug. 15, 2016

(65) Prior Publication Data
US 2017/0054097 A1    Feb. 23, 2017

Related U.S. Application Data

(60) Provisional application No. 62/283,091, filed on Aug. 20, 2015, provisional application No. 62/283,881, filed on Sep. 14, 2015.

(51) Int. Cl.
*H01L 51/42* (2006.01)
*H01L 51/44* (2006.01)
(Continued)

(52) U.S. Cl.
CPC ...... *H01L 51/4253* (2013.01); *H01L 27/1446* (2013.01); *H01L 27/307* (2013.01);
(Continued)

(58) Field of Classification Search
CPC . H01L 51/4253; H01L 51/441; H01L 51/448; H01L 27/307; H01L 51/442; H01L 27/1466
See application file for complete search history.

(56) References Cited

U.S. PATENT DOCUMENTS 7,189,992 B2    3/2007    Wager, III et al.
7,230,271 B2    6/2007    Yamazaki et al.
(Continued)

FOREIGN PATENT DOCUMENTS

CN      102916085 A      2/2013
WO        0133634 A1     5/2001
WO     2011099336 A1     8/2011

OTHER PUBLICATIONS

Extended European Search Report for EP 15158510.6, dated Sep. 21, 2015, 6 pages.
(Continued)

*Primary Examiner* — Michael Trinh
(74) *Attorney, Agent, or Firm* — Slater Matsil, LLP

(57) ABSTRACT

A method of manufacturing an image sensor device includes providing a metalized thin film transistor layer on a glass substrate; forming an inter-layer dielectric layer on the metalized thin film transistor layer; forming a via through the inter-layer dielectric layer; forming a metal layer the inter-layer dielectric and within the inter-layer dielectric layer via for contacting the metalized thin film transistor layer; forming a bank layer on the metal layer and the inter-layer dielectric layer; forming a via through the bank layer; forming an electron transport layer on the bank layer and within the bank layer via for contacting an upper surface of the metal layer; forming a bulk heterojunction layer on the electron transport layer; forming a hole transport layer on the bulk heterojunction layer; and forming a top contact layer on the hole transport layer.

17 Claims, 34 Drawing Sheets

(51) Int. Cl.
*H01L 27/30* (2006.01)
*H01L 27/144* (2006.01)
*H01L 51/00* (2006.01)

(52) U.S. Cl.
CPC ...... *H01L 51/0004* (2013.01); *H01L 51/0022* (2013.01); *H01L 51/441* (2013.01); *H01L 51/442* (2013.01); *H01L 51/448* (2013.01); *Y02E 10/549* (2013.01)

(56) References Cited

U.S. PATENT DOCUMENTS

| | | | |
|---|---|---|---|
| 7,382,421 | B2 | 6/2008 | Hoffman et al. |
| 7,902,004 | B2* | 3/2011 | Weisfield .......... H01L 27/14698 257/72 |
| 8,021,204 | B2* | 9/2011 | Yamazaki .......... H01L 27/3246 216/58 |
| 8,098,351 | B2 | 1/2012 | Kar-Roy |
| 8,461,545 | B2* | 6/2013 | Imai .................. H01L 27/14625 250/370.11 |
| 8,558,453 | B2 | 10/2013 | Sakakura et al. |
| 8,610,232 | B2* | 12/2013 | Coe-Sullivan ........ G01J 3/2803 257/448 |
| 8,956,907 | B2 | 2/2015 | Ono et al. |
| 8,987,724 | B2 | 3/2015 | Benwadih |
| 9,009,637 | B2 | 4/2015 | Premont et al. |
| 9,178,102 | B2 | 11/2015 | Fujita et al. |
| 9,269,737 | B1 | 2/2016 | O'Rourke et al. |
| 9,484,537 | B2 | 11/2016 | Liang et al. |
| 2005/0277208 | A1 | 12/2005 | Nakazawa et al. |
| 2006/0261342 | A1 | 11/2006 | Wells |
| 2007/0104891 | A1 | 5/2007 | Fournand |
| 2008/0237474 | A1 | 10/2008 | Tonotani et al. |
| 2009/0134399 | A1* | 5/2009 | Sakakura .......... H01L 27/3244 257/72 |
| 2010/0044711 | A1 | 2/2010 | Imai |
| 2010/0320391 | A1 | 12/2010 | Antonuk |
| 2012/0025189 | A1 | 2/2012 | Jeon et al. |
| 2012/0033161 | A1 | 2/2012 | Han et al. |
| 2012/0061578 | A1 | 3/2012 | Lim et al. |
| 2012/0248452 | A1 | 10/2012 | Yeo et al. |
| 2012/0268427 | A1 | 10/2012 | Slobodin |
| 2012/0300147 | A1 | 11/2012 | Shieh et al. |
| 2013/0075719 | A1 | 3/2013 | Nakano et al. |
| 2013/0107153 | A1 | 5/2013 | Qin |
| 2013/0140568 | A1 | 6/2013 | Miyamoto et al. |
| 2013/0161626 | A1 | 6/2013 | Jo et al. |
| 2013/0187161 | A1 | 7/2013 | Yamazaki |
| 2013/0229590 | A1 | 9/2013 | Kim |
| 2013/0313545 | A1 | 11/2013 | Saito et al. |
| 2014/0197412 | A1 | 7/2014 | Nishimura et al. |
| 2014/0256081 | A1* | 9/2014 | Hammond .......... H01L 51/4253 438/82 |
| 2015/0060775 | A1* | 3/2015 | Liang .................. H01L 51/002 257/40 |
| 2016/0013243 | A1 | 1/2016 | O'Rourke et al. |

OTHER PUBLICATIONS

Liu et al., "Solution-processed near-infrared polymer photodetectors with an inverted device structure", Organic Electronics 13 (2012) 2929-2934.

Gelinck et al., "X-ray imager using solution processed organic transistor arrays and bulk heterojunction photodiodes on thin, flexible plastic substrate", Organic Electronics 14 (2013) 2602-2609.

Arredondo et al., "Performance of ITO-free inverted organic bulk heterojunction photodetectors: Comparison with standard device architecture", Organic Electronics 14 (2013) 2484-2490.

Tedde et al, "Fully Spray Coated Organic Photodiodes", Nano Letters, vol. 9, No. 3, 2009, American Chemical Society, Washington, DC, 5 pgs.

Chuang et al., "P-13: Photosensitivity of Amorphous IGZO TFTs for Active-Matrix Flat-Panel Displays", SID 08 Digest, 2008, 1215-1218.

International Search Report and Written Opinion for International Application No. PCT/US2016/047156, dated Oct. 28, 2016, 10 pgs.

Japanese Non-Final Office Action with English Translation for Application No. 2015-047553, dated Jan. 17, 2017.

* cited by examiner

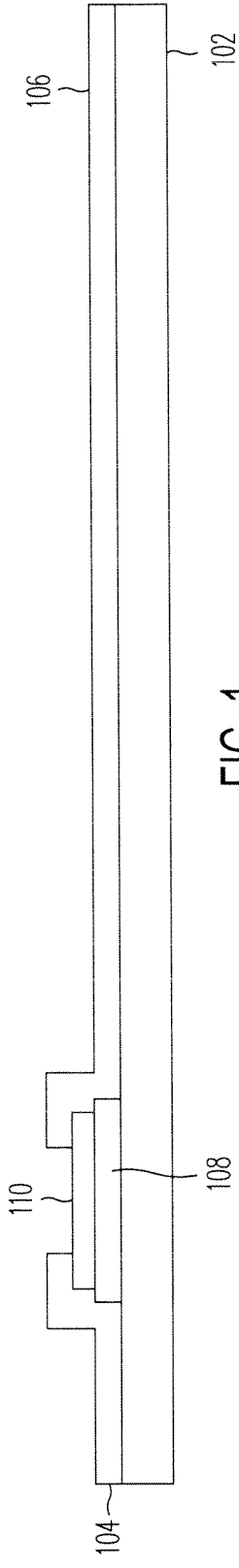
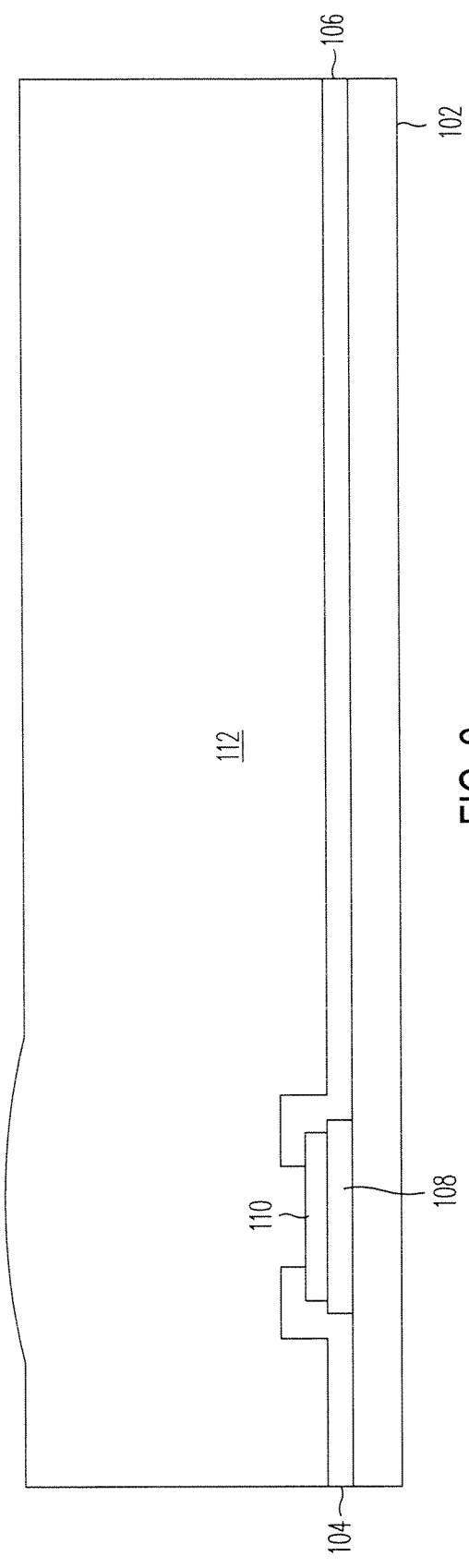

METHOD OF MANUFACTURING AN IMAGE SENSOR DEVICE

CROSS-REFERENCE TO RELATED APPLICATIONS

The present application claims the benefit of priority to U.S. Patent Application No. 62/283,091, filed Aug. 20, 2015 and U.S. Patent Application No. 62/283,881 filed Sep. 14, 2015 which are hereby incorporated by reference in their entirety for all purposes as if fully set forth herein.

BACKGROUND OF THE INVENTION

Field of the Invention

The present invention is related to a method for manufacturing image sensor devices, and particularly image sensor devices formed on a glass substrate suitable for use in X-ray imaging.

Description of the Related Art

While image sensor devices are known in the art, they are typically manufactured using materials and processes found in the semiconductor industry. This is also largely true for image sensor devices formed on a glass substrate suitable for use in X-ray imaging. These materials and processes, while perfectly suited for manufacturing of the image sensors can result in high manufacturing costs. Non-traditional materials, such as organic materials can be used to reduce these manufacturing costs and have many other performance and manufacturing advantages. However, it can be difficult to combine the remaining traditional semiconductor materials and manufacturing processes with organic materials and processes. What is desired, therefore, is a method for manufacturing image sensor devices, particularly on a glass or plastic substrate that is both economical and fully compatible with traditional semiconductor manufacturing methods and materials.

SUMMARY OF THE INVENTION

According to a first embodiment of the invention, a method of manufacturing an image sensor device includes providing a metalized thin film transistor layer form on a glass substrate; forming an inter-layer dielectric layer on the metalized thin film transistor layer; forming a via through the inter-layer dielectric layer; forming a metal layer on an upper surface of the inter-layer dielectric and within the inter-layer dielectric layer via for contacting the metalized thin film transistor layer; forming a bank layer on an upper surface of the metal layer and the inter-layer dielectric layer; forming a via through the bank layer; forming an electron transport layer on an upper surface of the bank layer and within the bank layer via for contacting an upper surface of the metal layer; forming a bulk heterojunction layer on an upper surface of the electron transport layer; forming a hole transport layer on an upper surface of the bulk heterojunction layer; and forming a top contact layer on an upper surface of the hole transport layer.

According to a second embodiment of the invention, a method of manufacturing an image sensor device includes providing a metalized thin film transistor layer form on a glass substrate; forming a first inter-layer dielectric layer on the metalized thin film transistor layer; forming a via through the first inter-layer dielectric layer; forming a metal layer on an upper surface of the first inter-layer dielectric and within the first inter-layer dielectric layer via for contacting the metalized thin film transistor layer; forming a second inter-layer dielectric layer on an upper surface of the metal layer and the first inter-layer dielectric layer; forming a via through the second inter-layer dielectric layer; forming a conductive oxide layer on an upper surface of the second inter-layer dielectric layer and within the second inter-layer dielectric layer via for contacting an upper surface of the metal layer; forming an electron transport layer on an upper surface of the second inter-layer dielectric layer and the conductive oxide layer; forming a bulk heterojunction layer on an upper surface of the electron transport layer; forming a hole transport layer on an upper surface of the bulk heterojunction layer; and forming a top contact layer on an upper surface of the hole transport layer.

According to a third embodiment of the invention, a method of manufacturing an image sensor device includes providing a metalized thin film transistor layer form on a glass substrate; forming a first inter-layer dielectric layer on the metalized thin film transistor layer; forming a via through the first inter-layer dielectric layer; forming a metal layer on an upper surface of the first inter-layer dielectric and within the first inter-layer dielectric layer via for contacting the metalized thin film transistor layer; forming a second inter-layer dielectric layer on an upper surface of the metal layer and the first inter-layer dielectric layer; forming a via through the second inter-layer dielectric layer; forming a conductive oxide layer on an upper surface of the second inter-layer dielectric layer and within the second inter-layer dielectric layer via for contacting an upper surface of the metal layer; forming a bank layer on an upper surface of the second inter-layer dielectric layer and the conductive oxide layer; forming a via through the bank layer; forming an electron transport layer on an upper surface of the bank layer and within the bank layer via to contact an upper surface of the conductive oxide layer; forming a bulk heterojunction layer on an upper surface of the electron transport layer; forming a hole transport layer on an upper surface of the bulk heterojunction layer; and forming a top contact layer on an upper surface of the hole transport layer.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention as claimed.

BRIEF DESCRIPTION OF THE DRAWINGS

FIGS. 1-14 are sequential cross-sectional drawings of a method of manufacturing an image sensor device according to a first embodiment of the invention;

DETAILED DESCRIPTION

Figure 3:
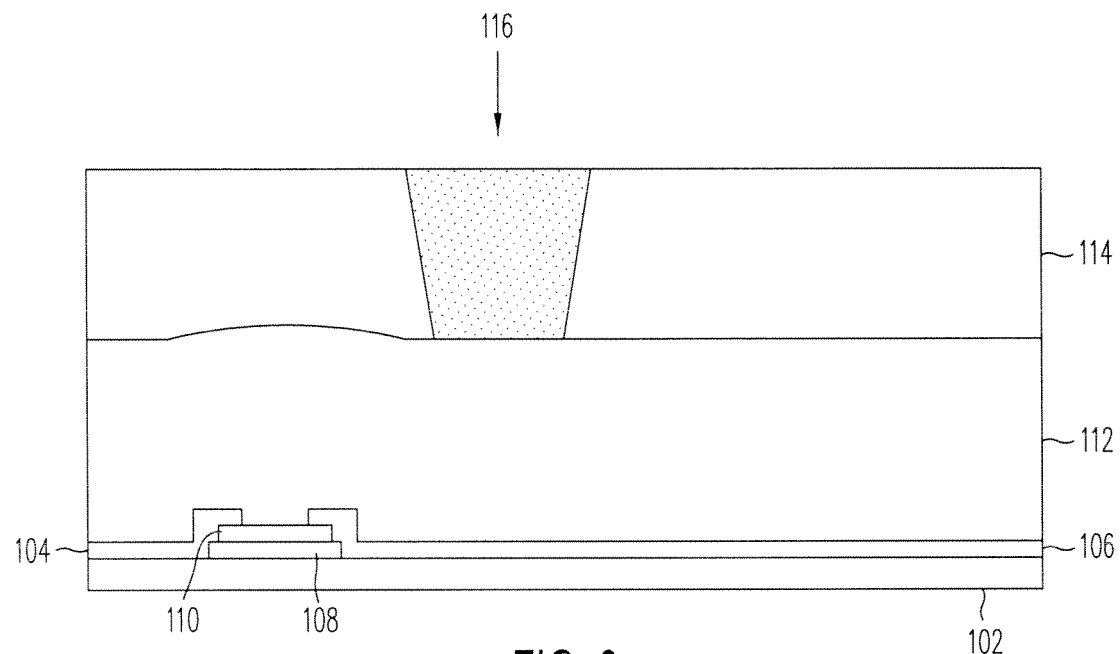

An Organic Photo-Diode ("OPD") manufacturing process for a first embodiment is described below with respect to drawing FIGS. 1-14.

FIG. 1 shows a portion of a Thin-Film Transistor ("TFT") array including a glass substrate 102, a data line 104, a line 106 for coupling to the photodiode stack to the data line of the sensor array, a gate 108, and an island 110. The substrate 102 is typically glass, but a plastic substrate (using polyethylene naphthalate, polyethylene terephthalate, or polyimide) can also be used. The material for lines 104 and 106 is typically Chrome ("Cr") with a nominal thickness of about 500 Angstroms. The material is deposited using Physical Vapor Deposition ("PVD"). The material for gate 108 can include Aluminum ("Al") with a nominal thickness of about 1300 Angstroms combined with Titanium Tungsten ("TiW") with a nominal thickness of about 200 Angstroms. The material for gate 108 can be applied used Physical Vapor Deposition ("PVD"). The gate 108 dielectric material can be Silicon Nitride ("SiN") having a nominal thickness of about 3300 Angstroms, amorphous Silicon ("a-Si") having a nominal thickness of about 500 Angstroms, and SiN having a nominal thickness of about 1500 Angstroms. The material for the gate 108 dielectric can be applied using Plasma-Enhanced Chemical Vapor Deposition ("PECVD"). The active portion (source-drain, or island 110) of the TFT is formed of microcrystalline Silicon ("µc-Si silicon") having a nominal thickness of about 500 Angstroms and a Chromium layer ("Cr") having a nominal thickness of about 800 Angstroms. The island 110 can be formed using both PECVD and PVD.

FIG. 2 shows the application of an Inter-Layer Dielectric ILD film layer 112 (ideal thickness 0.5 um to 2.0 um) onto the TFT layer of FIG. 1 using PECVD. The PECVD process temperature is ideally between 200° C. and 300° C. ILD materials can include SiON or SiO2 and SiN.

FIG. 3 shows the application of a photoresist layer 114 to pattern a via in the ILD layer 112. The photoresist layer 114 is exposed to light such that portion 116 will be preferentially etched for the subsequent via in the ILD layer 112. The photoresist layer can be a positive-toned, novalac-based resin material. The typical thickness of the material is between 2.0 um to 8.0 um and it is deposited using an extrusion coater, or slit coater.

Figure 4:
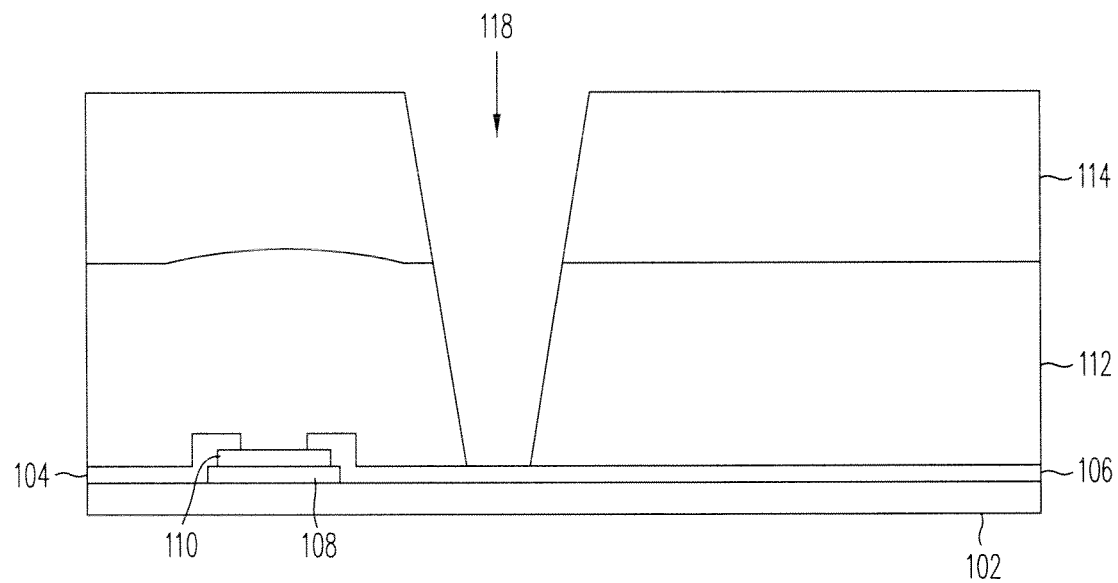

FIG. 4 shows the etching of the SiON (or other PECVD dielectric) ILD layer 112 using either wet (HF type chemistry) or dry (F plasma; ideally CF4 or SF6) to create the via 118 used to contact metal layer 106.

Figure 5:
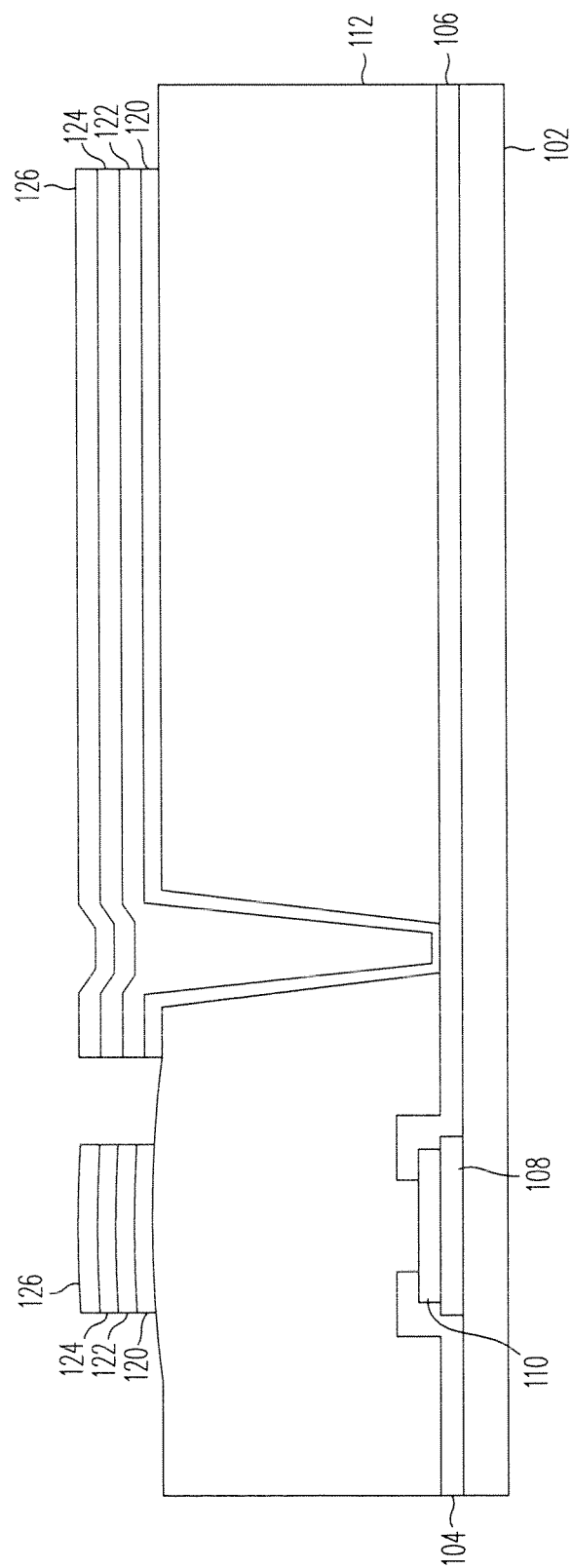

FIG. 5 shows the deposition of a metal stack including layers 120, 122, 124, and 126. The metal layers are patterned into two patterned stacks to form the light shield for the TFT and also to form the bottom contact, or cathode of the photodiode. Following etch, the metal interconnect layer is deposited by PVD/sputtering. This process comprises using a quad-layer metal stack, beginning from the bottom layer 120, of TiW, Al, TiW, and ITO or Chrome, Al, TiW, and ITO. Typical film thickness is 200 A to 1000 A for the first layer 120, 1000 A to 10000 A for the Al layer 122, 200 A to 1000 A for the third layer 124, and 100 A to 800 A for the fourth layer 126. All depositions are performed at a temperature of less than 100° C. Alternatives to this approach include replacement of Cr or TiW with other refractory metals (examples include Mo, MoW, Ti, etc.), alternative conductors from Al (examples include Cu, Al:Nd, Al:Si, Ag, etc.). Alternatively the fourth layer 126 can be replaced with a conductive oxide, including but not limited to ITO, IGZO, IZO, ITZO, or AZO.

Figure 6:
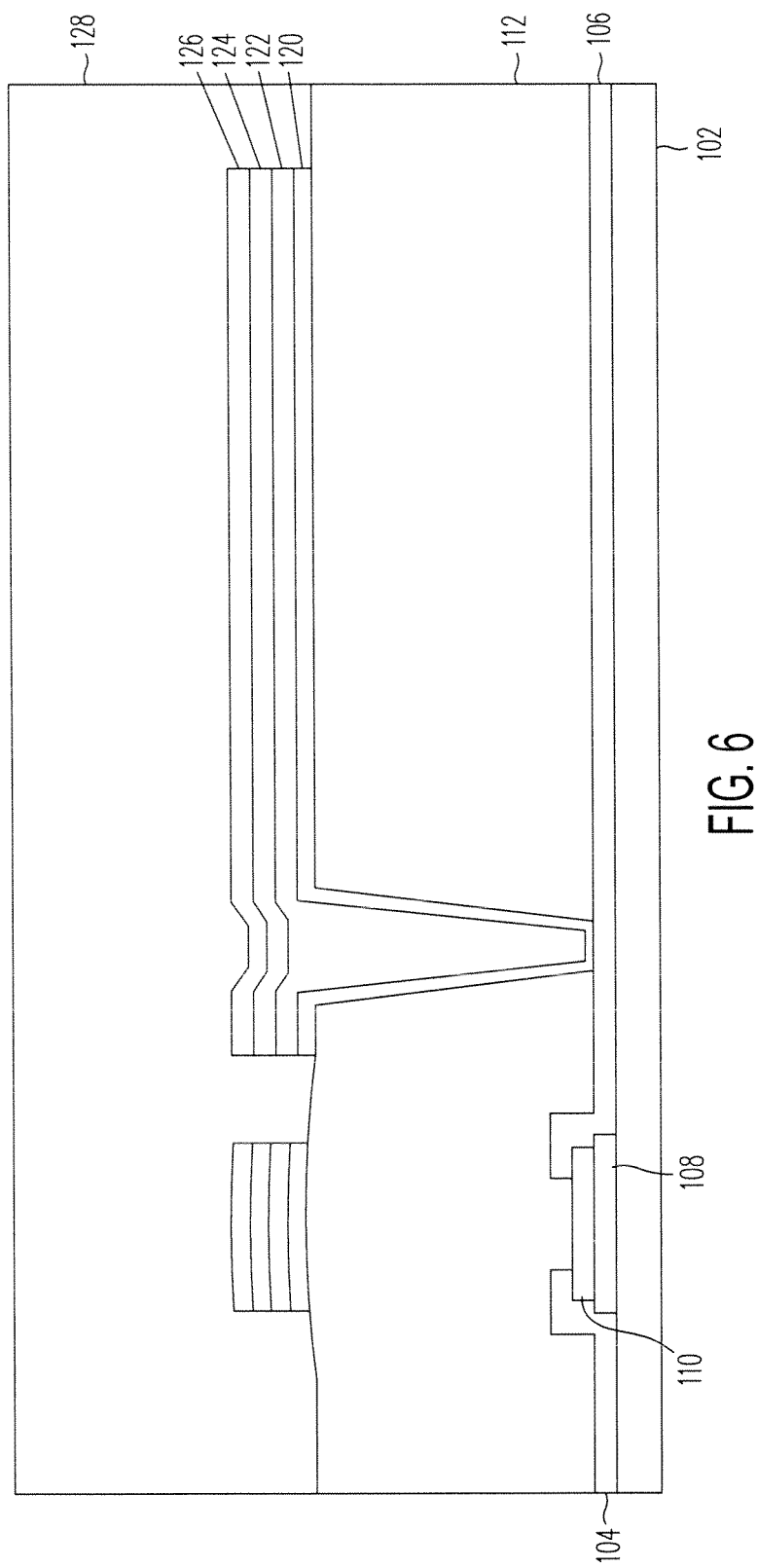

FIG. 6 shows the deposition of the bank layer 128, which can be a resin material. The bank layer 128 is deposited on the ILD layer 112 and the patterned metal layers 120, 122, 124, 126, using a solution process (i.e. extrusion, slot die, spin coating, spray coating or inkjet). The ideal thickness of the bank layer 128 is between 1.0 um to 6.0 um. The bank layer 128 is deposited at an ambient temperature followed by a soft bake (to remove solvents) at T=50° C. to 100° C. The bank layer 128 materials may include (but not limited to) Dow Chemical Cyclotene 6100 series (or variants thereof), Honeywell PTS series, Microchem SU-8, TOK TPIR PN-0371D or other such resin materials that are known in the art. The bank material described above provides excellent planarization (>90%) over the entire substrate.

Figure 7:
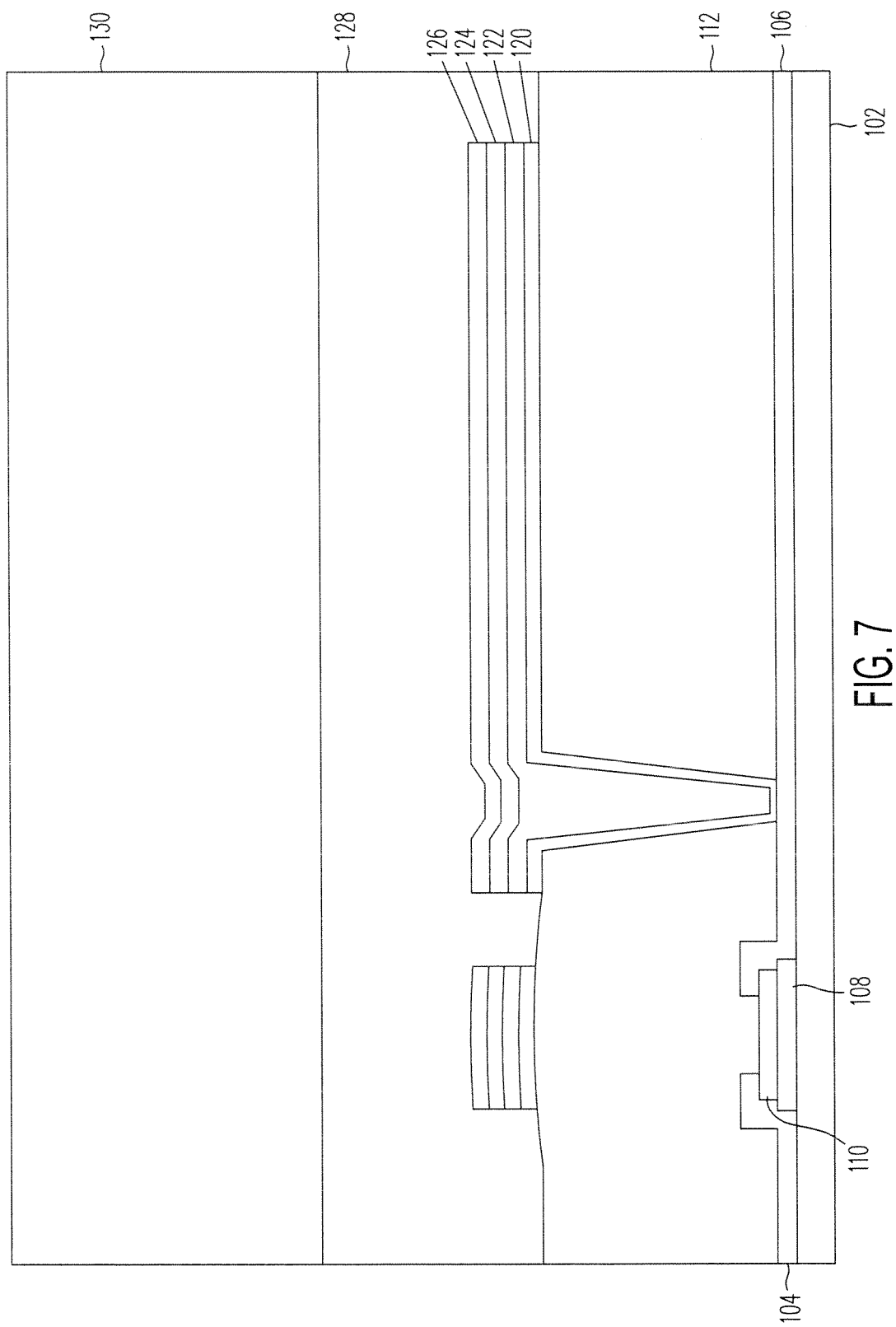

FIG. 7 shows the application of a photoresist layer 130 to an upper surface of the bank layer 128. The bank material in layer 128 is cured (T=200° C. to 300° C.; ideally less than 250° C.) in an N2 atmosphere for 1-6 hours followed by coating with the photoresist layer 130 is a positive-toned, novalac-based resin material. The typical thickness of the material is between 2.0 um to 8.0 um and it is deposited using an extrusion coater, or slit coater.

Figure 8:
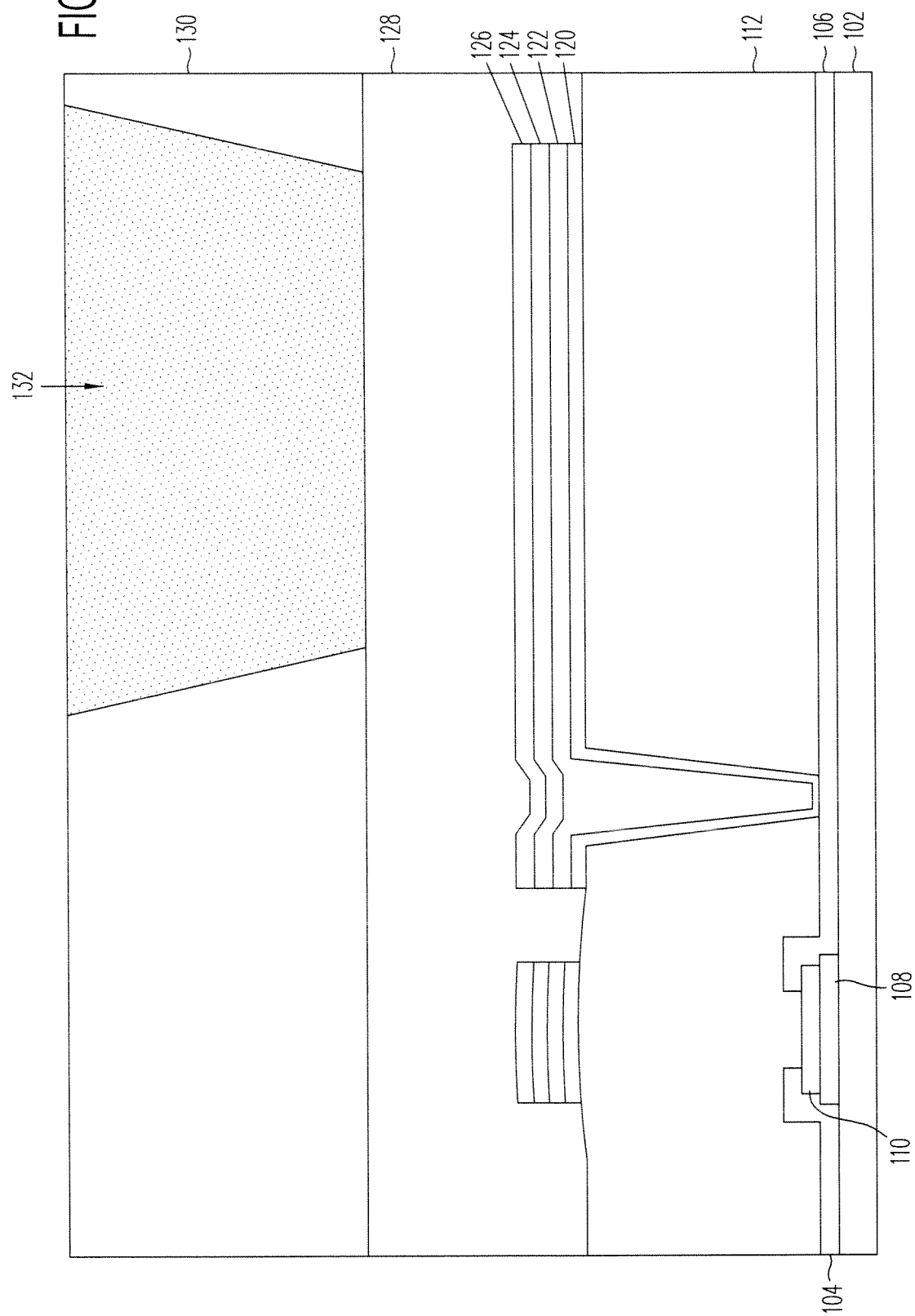

FIG. 8 shows the patterning of the photoresist layer 130 at portion 132. The photoresist is patterned by i-line exposure and developed to form individual pixel wells down to the bank layer 128. A typical dose range is 75 mJ to 200 mJ (ideally 90-125 mJ) and the thickness of the photoresist layer is between 1.0 um to 10.0 um, ideally 2.0 um to 5.0 um.

Figure 9:
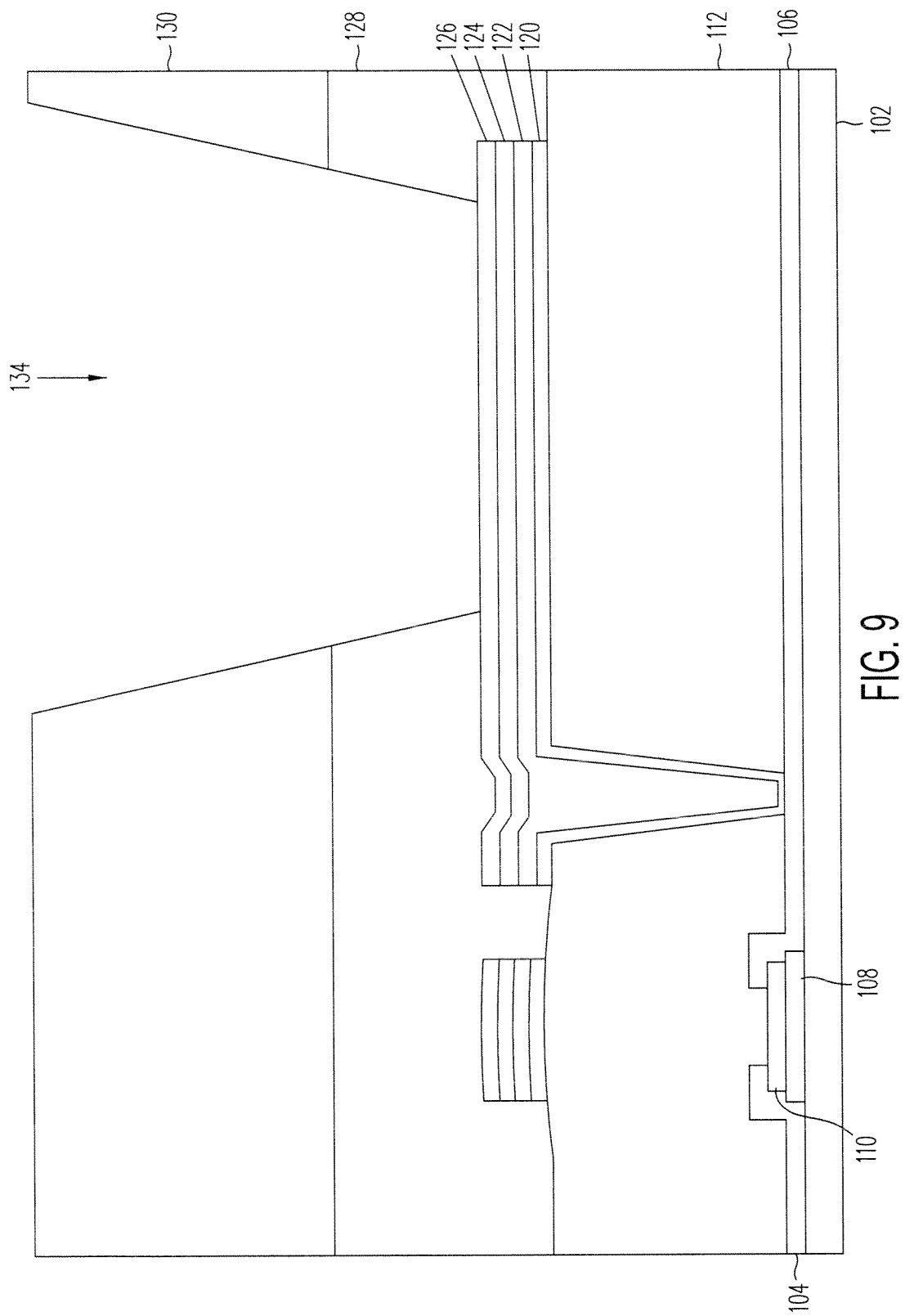

FIG. 9 shows via 134 through the photoresist 130 and bank layer 128. Following inspection, the individual pixel wells 134 are etched, using an F-containing (i.e. CF4, SF6, etc.) plasma process, into the bank layer 128. Note that the upper surface of metal layer 126 is exposed.

Figure 10:
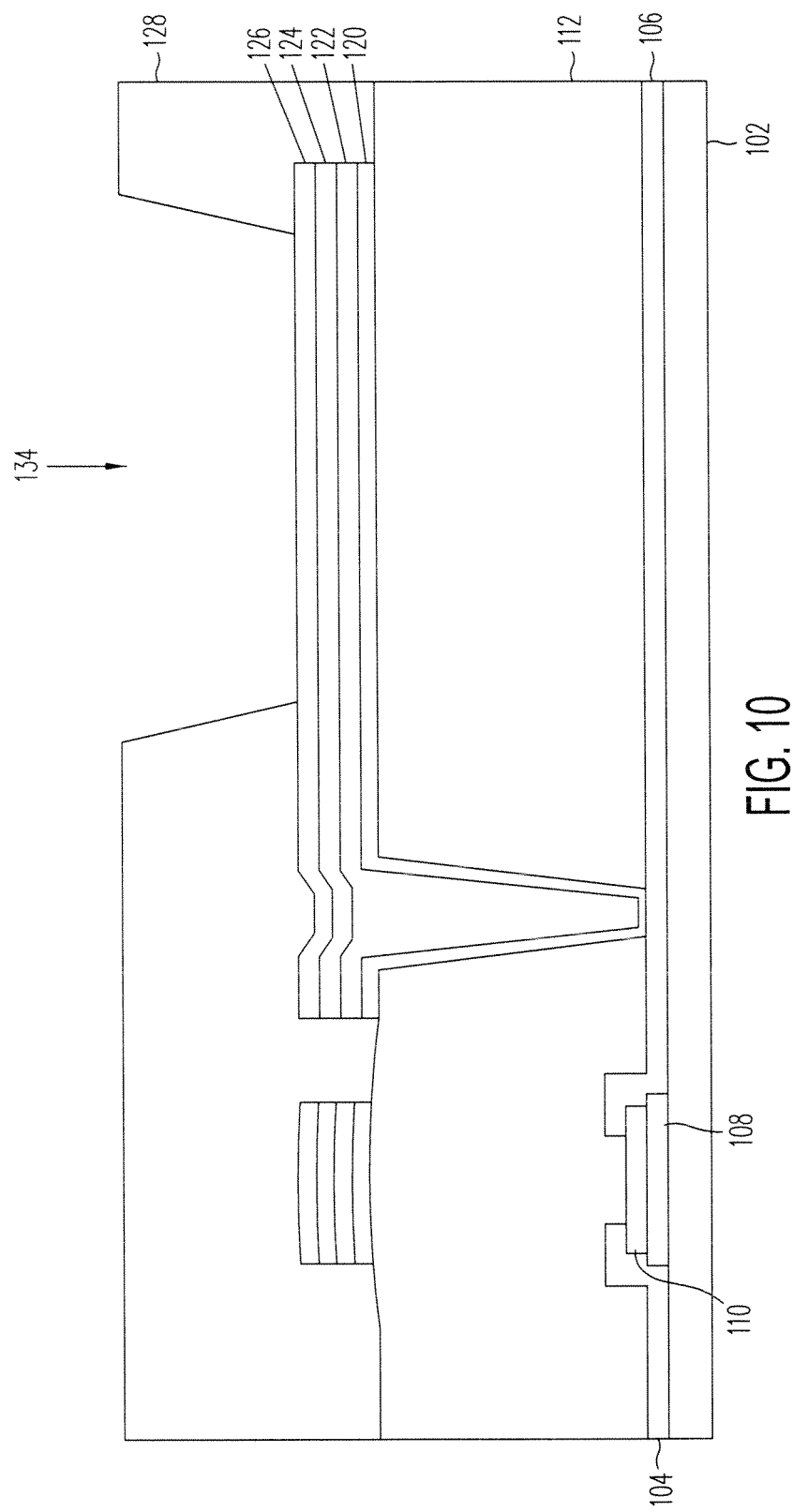

FIG. 10 shows that the photoresist layer 130 is removed. The photoresist layer 130 is stripped (using PRS-2000 stripper or other strippers known in the art). The bank layer 128 material is immune to the strip chemistry and remains as part of the device. Following the strip process, the individual pixel wells are formed to create the organic photodiode later in the process, as will be explained in further detail below. It is also worth noting that the bank layer 128 material is highly planar, thus providing excellent dielectric separation between the metal layer features.

Figure 11:
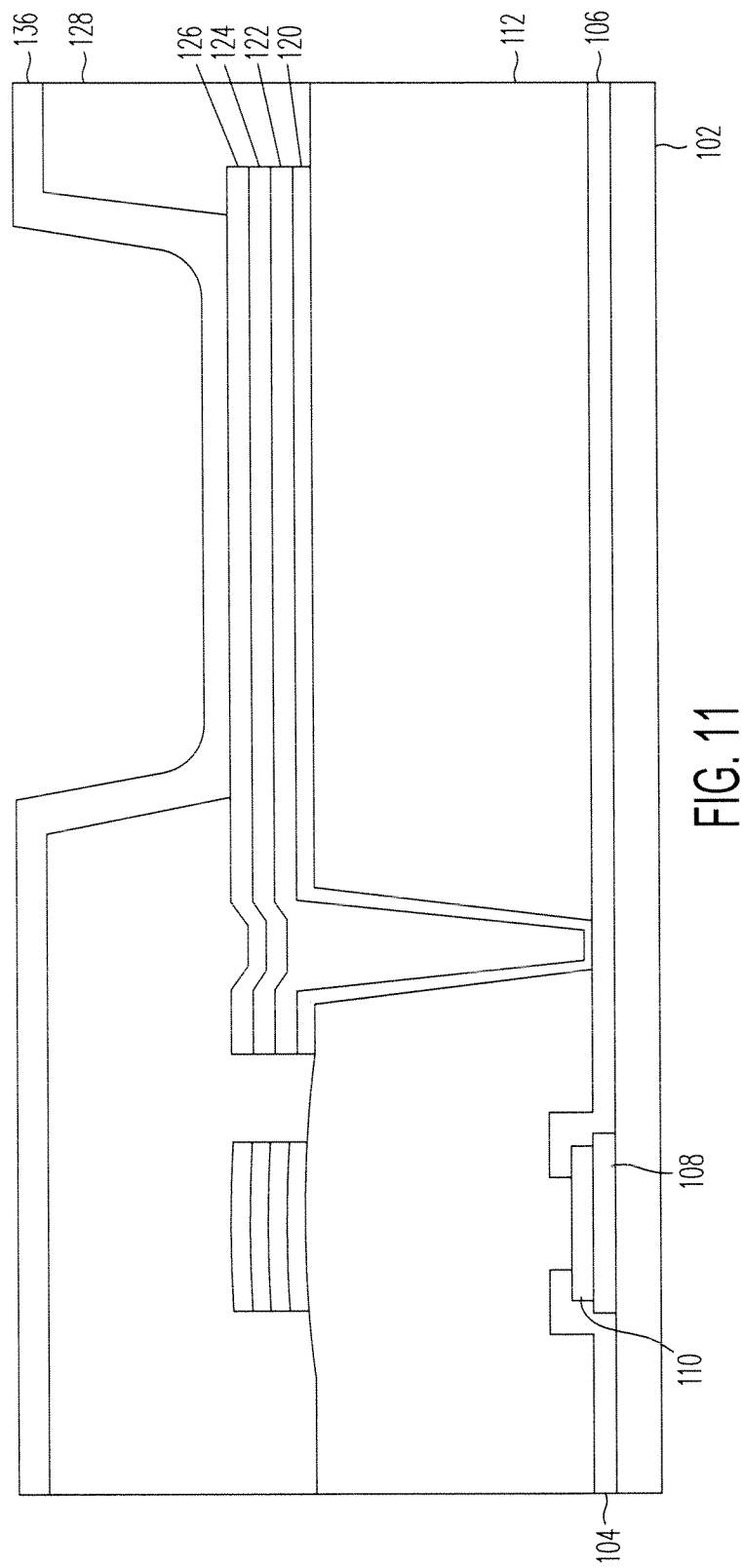

FIG. 11 shows the deposition of the Electron Transport Layer ("ETL") 136. The ETL layer 136 has the function of tuning, or bridging the work function of the ITO (cathode) with the work function of the bulk heterojunction layer material. The material can be PEIE (ethoxylated polyethylenimine) and is ideally deposited onto each individual array. The ETL material can be applied by spin-coating, spray-coating or an inkjet process. The solution coats or fills, depending on the thickness deposited, each pixel well. Typical thicknesses range from 5 nm to 400 nm. The ETL layer 136 is then baked on a hot plate in a nitrogen environment for 5 to 20 minutes between 100° C. and 130° C. If an alternate material is used for layer 126, then this ETL layer 136 can be skipped in the process. The alternate material becomes the ETL layer.

Figure 12:
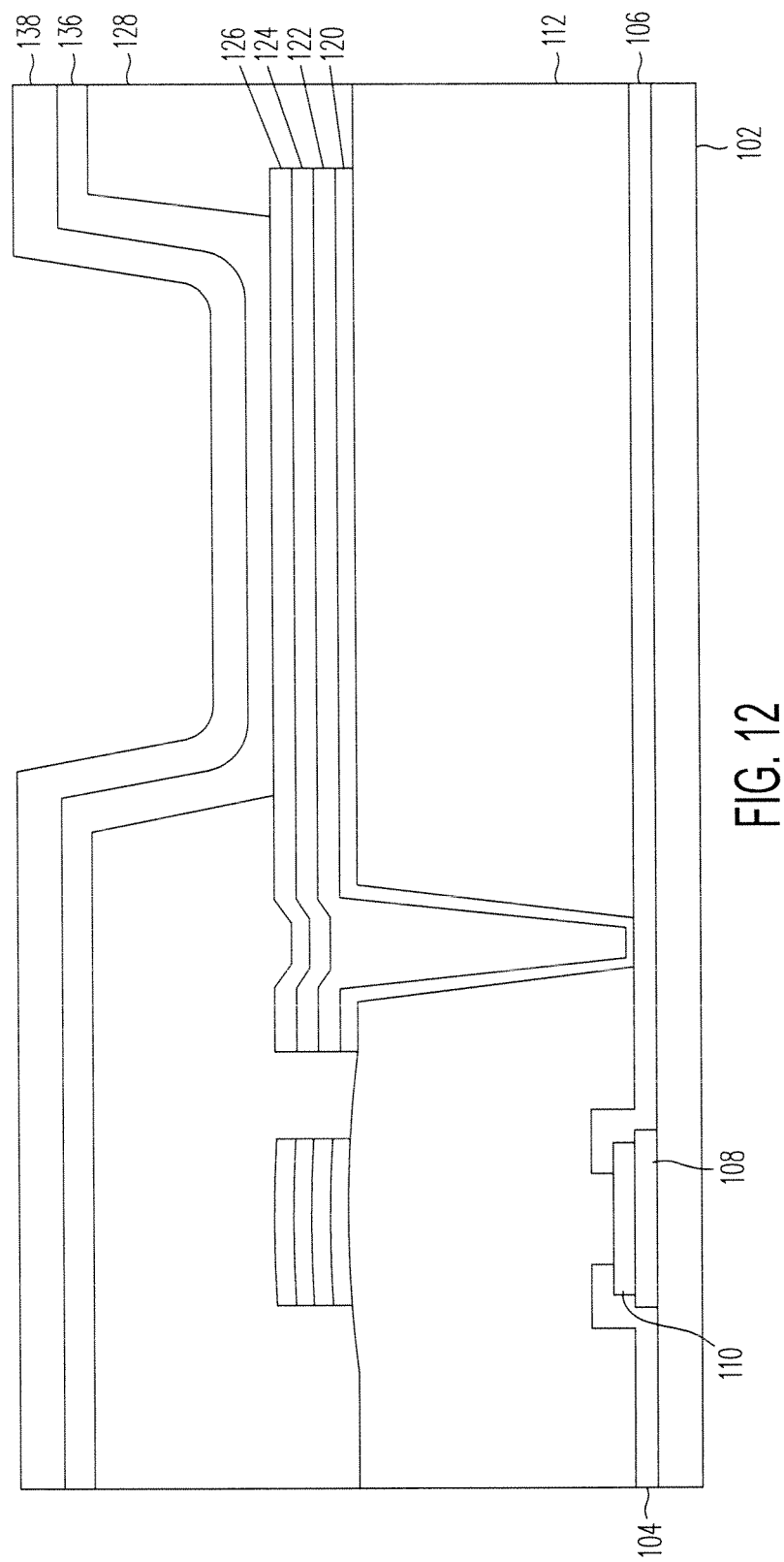

FIG. 12 shows the deposition of the Bulk Heterojunction Layer ("BHJ") 138. The BHJ layer 138 has the function of converting light into electrical charge. The BHJ consists of a donor/acceptor material mixed in a solvent or solvents. The electron donor material is typically, but not exclusively, poly(3-hexylthiophene) ("P3HT") and the electron acceptor is typically phenyl-C61-butyric acid methyl ester ("PC61BM" or "C60"). The BHJ material is deposited onto the ETL layer 136. The BHJ material can be applied by screen printing, slot-die coating, spin-coating, spray coating or by inkjet. The solution coats or fills, depending on the thickness deposited, each pixel well. Typical thicknesses range from 100 nm to 1000 nm. The BHJ layer 138 is then baked initially for 2 to 8 minutes between 50° C. to 80° C. to drive the solvent out slowly. Afterwards, the BHJ layer 138 is baked in a nitrogen environment or in vacuum between 110° C. and 130° C. for 3 to 10 minutes.

Figure 13:
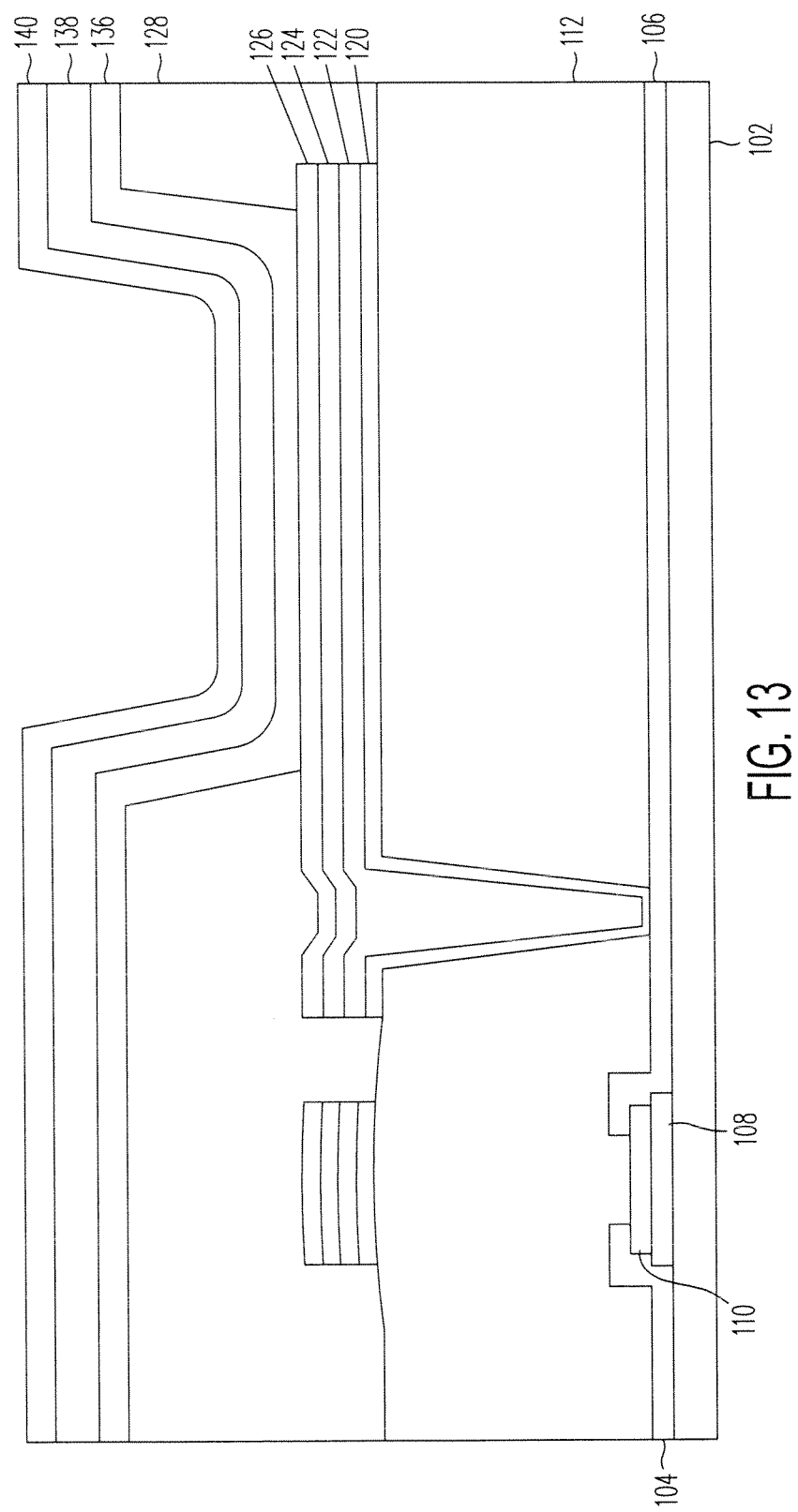

FIG. 13 shows the deposition of the Hole Transport Layer ("HTL") 140. The HTL layer 140 has the function of tuning, or bridging the work function of the BHJ with the work function of the anode layer, or top contact layer material and is ideally poly(3,4-ethylenedioxythiophene) polystyrene sulfonate ("PDOT:PSS") and is deposited onto the BHJ layer 138. The HTL material can be applied by spin-coating, spray-coating or an inkjet process. The solution coats or fills, depending on the thickness deposited, each pixel well. Typical thicknesses range from 5 nm to 400 nm. The MIL layer 140 is then baked on a hot plate in a nitrogen environment for 5 to 20 minutes between 100° C. to 130° C. Alternate materials for the HTL layer can be molybdenum trioxide ($MoO_3$). $MoO_3$ is deposited by evaporation process.

Figure 14:
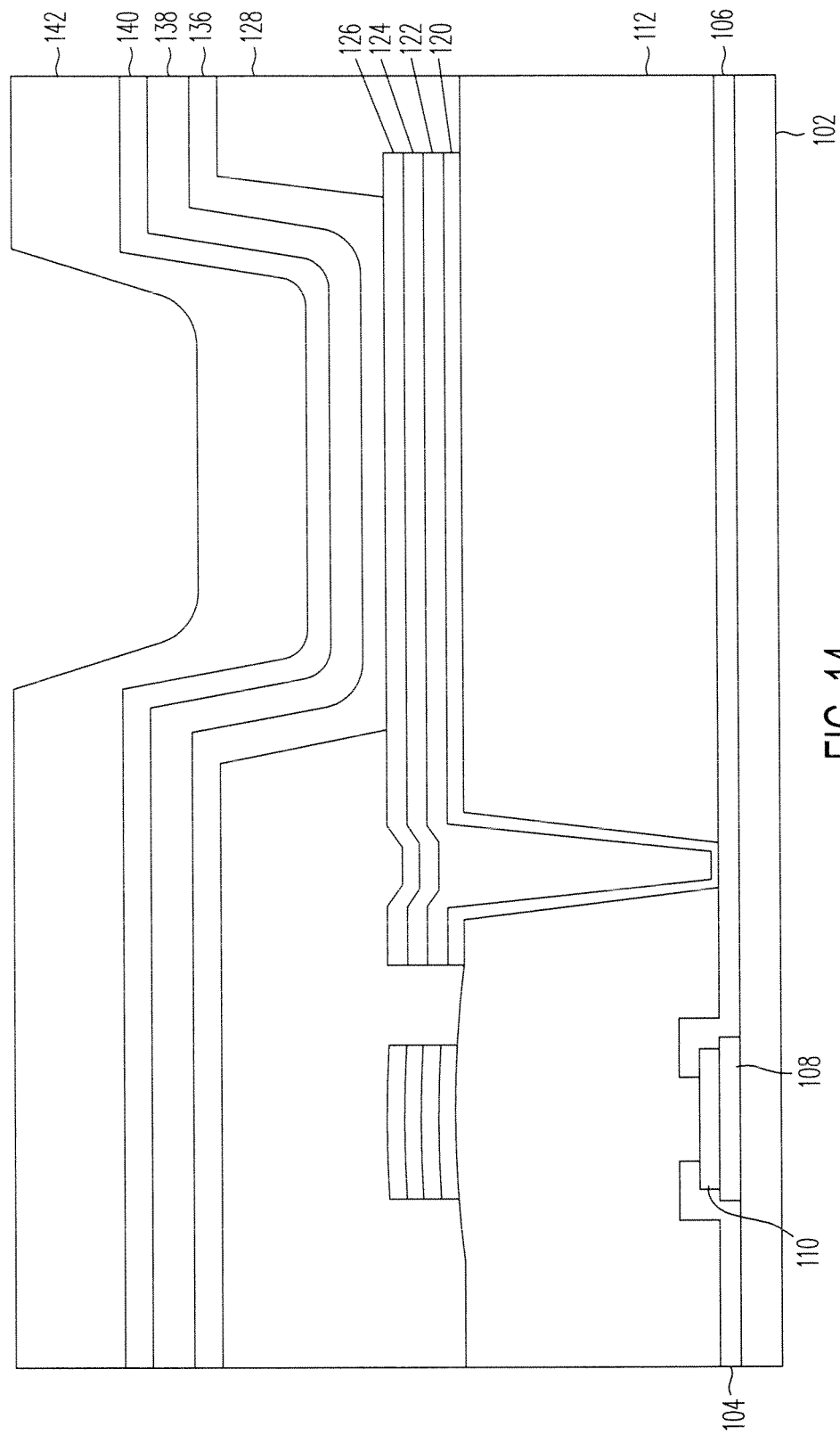

FIG. 14 shows the deposition of the Top Contact Layer ("TC") 142. The TC layer 142 has the function of acting as the top contact, or anode of the photodiode and can be either a transparent conductive material, such as different mixture of PDOT:PSS or silver nanowire and deposited onto the HTL layer 140. The TC material can be applied by screen printing, slot-die coating, spin-coating, spray coating or by an inkjet process. The solution coats or fills, depending on the thickness deposited, each pixel well. Typical thicknesses range from 100 nm to 1000 nm. The TC layer 142 is then baked initially for 2 to 8 minutes between 50° C. to 80° C. to drive the solvent out slowly. Afterwards, the TC layer 142 is baked in a nitrogen environment or in a vacuum between 110° C. and 130° C. for 3 to 10 minutes.

Further, with respect to FIG. 14, a grid bias it applied to the top contact TC layer 142 for proper electrical operation of the array. Layers 136 to 142 are not further patterned to create the individual pixels, as electrons impinging outside of the pixel wells are just absorbed and do not contribute to the individual pixel signals. A clear material that is compatible with layers 136 to 142 can be used as a moisture barrier and passivation layer (not shown).

The OPD manufacturing process steps related to a second and third embodiment of the present invention are shown in drawings FIGS. 15-25. The method of the second embodiment of the invention is completed with reference to FIGS. 26-29, and the method of the third embodiment of the invention is completed with reference to FIGS. 30-38.

Figure 15:
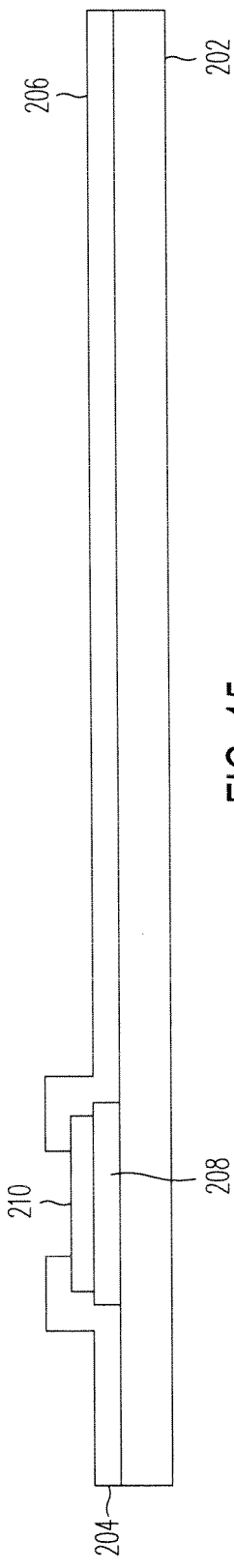
FIGS. 15-25 are sequential cross-sectional drawings of a method of manufacturing an image sensor device according to second and third embodiments of the invention.

FIG. 15 shows that the TFT layer is complete, using the process described above, including a substrate 202, metal lines 204 and 206, gate 208, and island 210.

Figure 16:
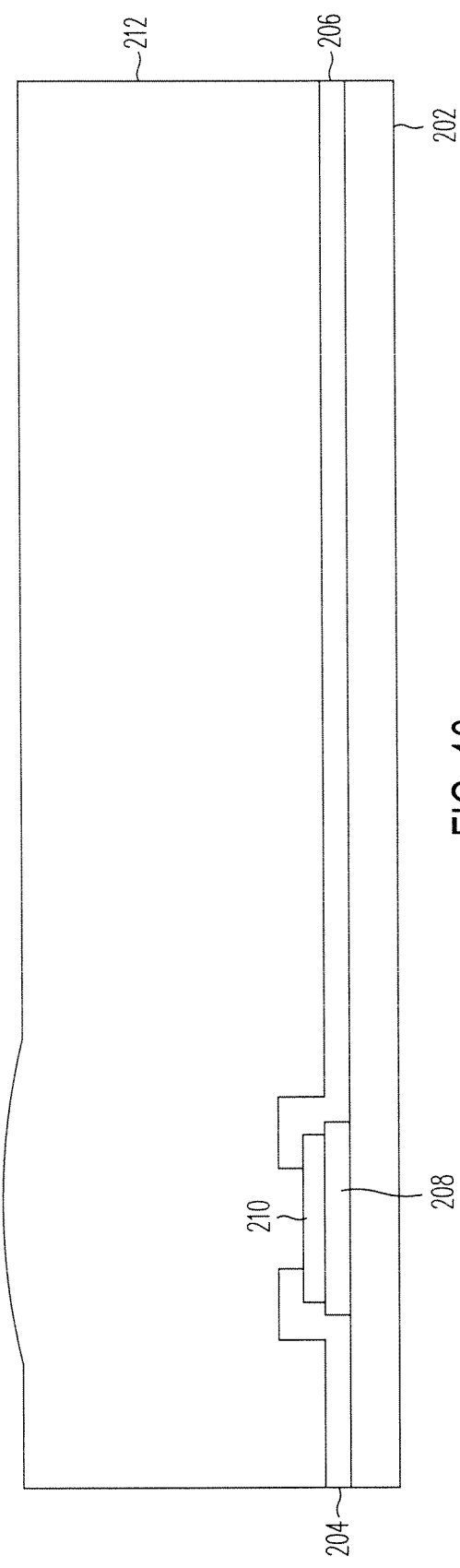

FIG. 16 shows the application of an ILD layer 212, as previously described. The ILD film 212 (ideal thickness 0.5 um to 2.0 um) is applied onto the TFT layer of FIG. 15 using PECVD. The PECVD process temperature is between 200° C. and 300° C. ILD materials can include SiON or $SiO_2$ and SiN.

Figure 17:
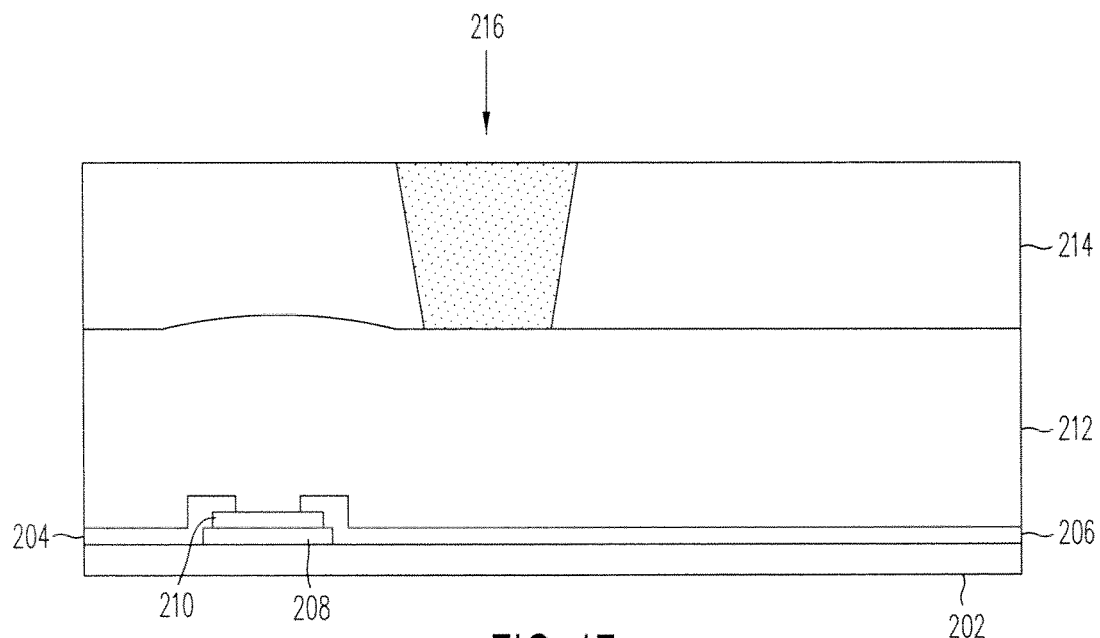

FIG. 17 shows the application of a photoresist layer 214 as previously described, and patterned at location 216.

Figure 18:
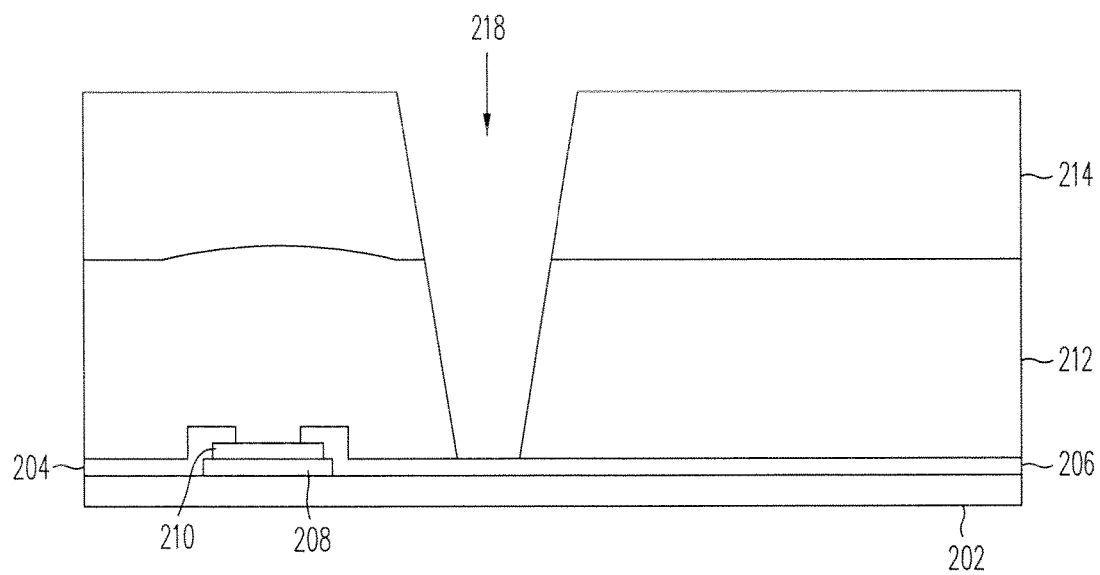

FIG. 18 shows the etching of the photoresist layer 214 and the ILD layer 212 as previously described. The SiON (or other PECVD dielectric) layer 212 is etched using either wet (HF type chemistry) or dry (F plasma; ideally CF4 or SF6).

Figure 19:
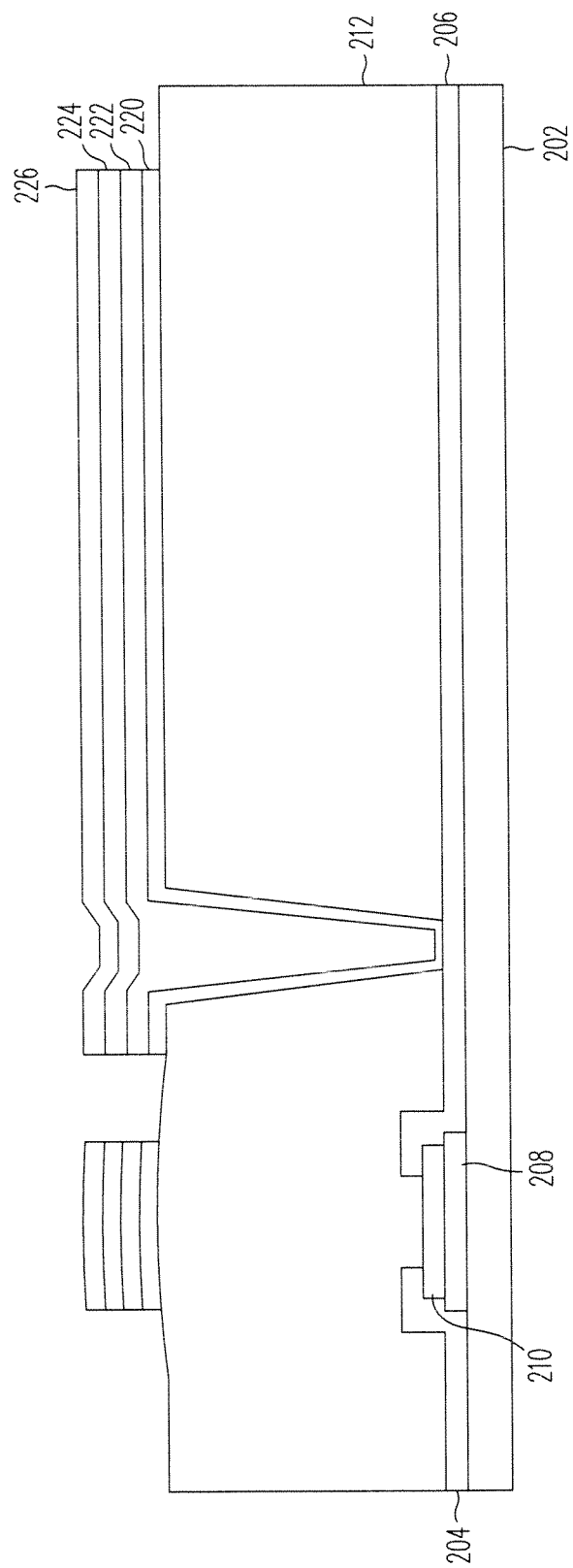

FIG. 19 shows the deposition of the quad-layer metal stack as previously described. Each metal interconnect layer is deposited by PVD/sputtering. This process includes using a quad-layer metal stack, beginning from the bottom layer 220, of TiW, Al, TiW, and ITO or Chrome, Al, TiW, and ITO.

Typical film thickness is 200 Angstroms to 1000 Angstroms for the first layer 220, 1000 Angstroms to 10000 Angstroms for the Al layer 222, 200 Angstroms to 1000 Angstroms for the third layer 224, and 100 Angstroms to 800 Angstroms for the fourth layer 226. All depositions are performed at a temperature of less than 100° C. Alternatives to this approach include replacement of Cr or TiW with other refractory metals (ex. Mo, MoW, Ti, etc.), alternative conductors from Al (ex. Cu, Al:Nd, Al:Si, Ag, etc.). Alternatively the fourth layer 226 can be replaced with a conductive oxide, including but not limited to ITO, IGZO, IZO, ITZO, or AZO.

Figure 20:
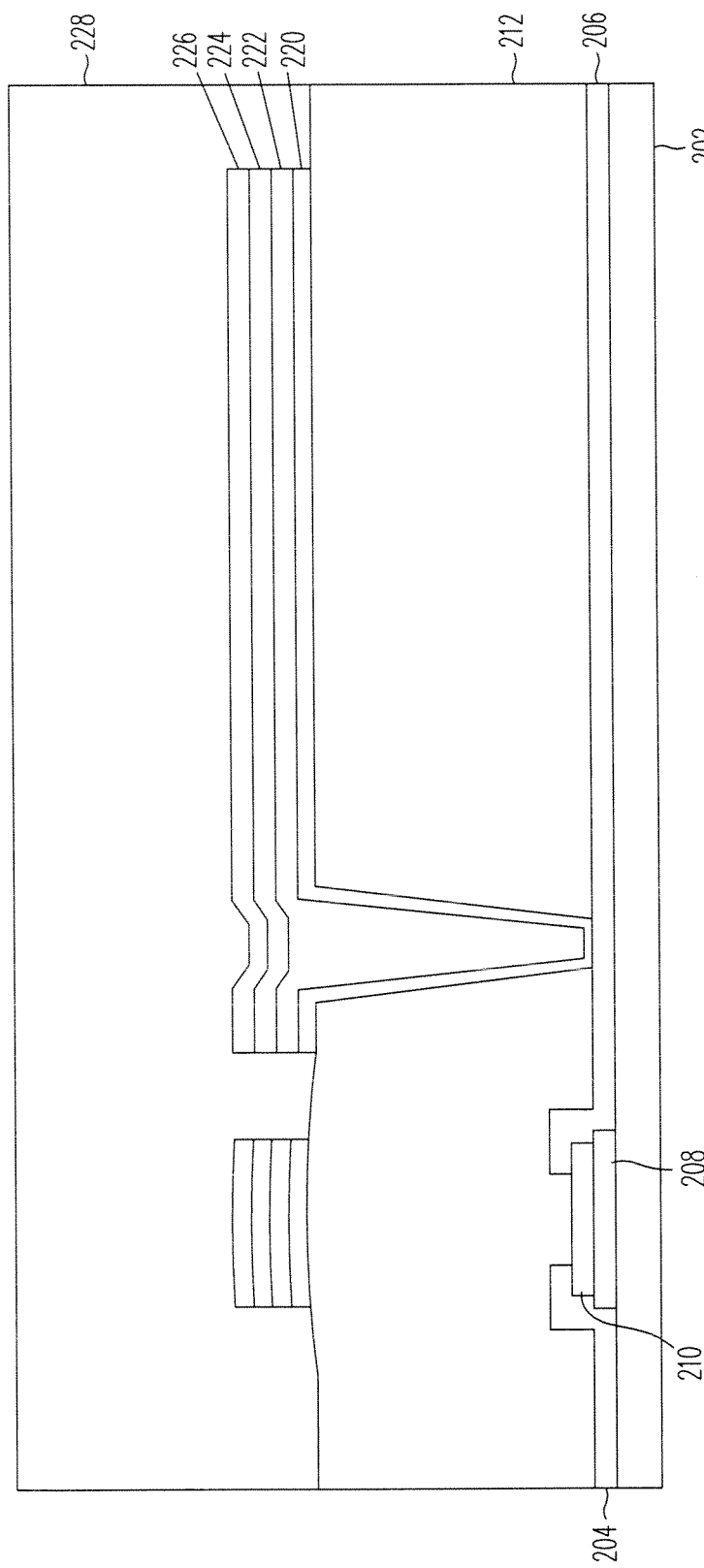

FIG. 20 shows the application of a second inter-layer dielectric layer 228 ("ILD2"). The ILD2 film layer 228 (ideal thickness 0.5 um to 2.0 um) is applied onto the ILD layer 212, the data metal and cathode contact of the OPD diode, using PECVD. The PECVD process temperature is between 200° C. and 300° C. As before, the ILD2 materials can include SiON or $SiO_2$ and SiN. The SiON (or other PECVD dielectric) of layer 228 is etched using either wet (HF type chemistry) or dry (F plasma; ideally CF4 or SF6). An alternative material would be to use a solution-based ILD material, deposited using an extrusion process, slot die process, spin coating, spray coating or inkjet). The ideal thickness of the ILD2 layer 228 is between 1.0 um to 6.0 um. The ILD2 layer 228 is deposited at ambient temperature followed by a soft bake (to remove solvents) at T=50° C. to 100° C. The ILD2 materials may include, but not limited to, Dow Chemical Cyclotene 6100 series (or variants thereof), Honeywell PTS series, Microchem SU-8, TOK TPIR PN-0371D or other material common in the art. The ILD2 material provides excellent planarization (>90%) over the entire substrate.

Figure 21:
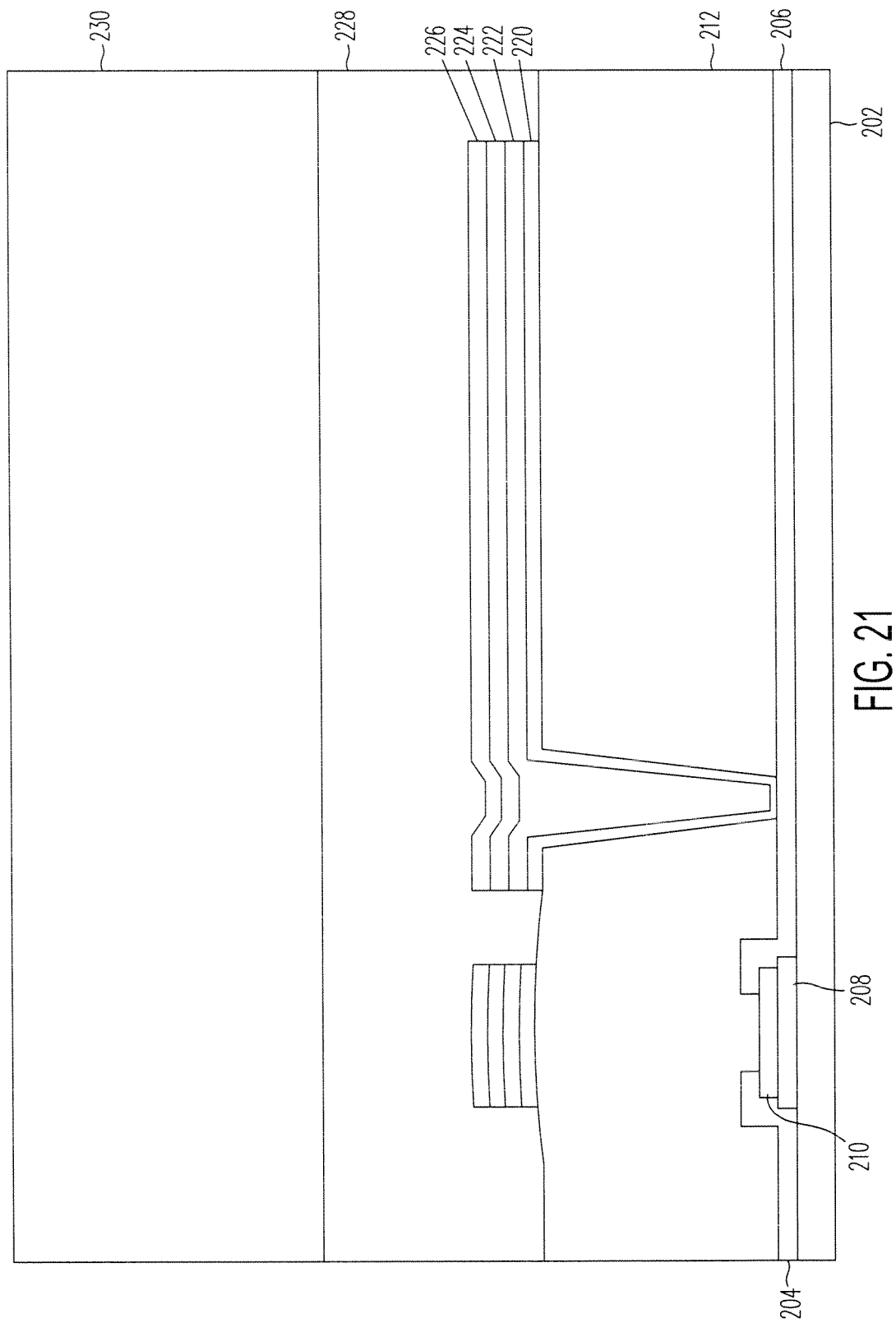

FIG. 21 shows the application of a photoresist layer 230 to the surface of the ILD2 layer 228, using materials and methods previously described.

Figure 22:
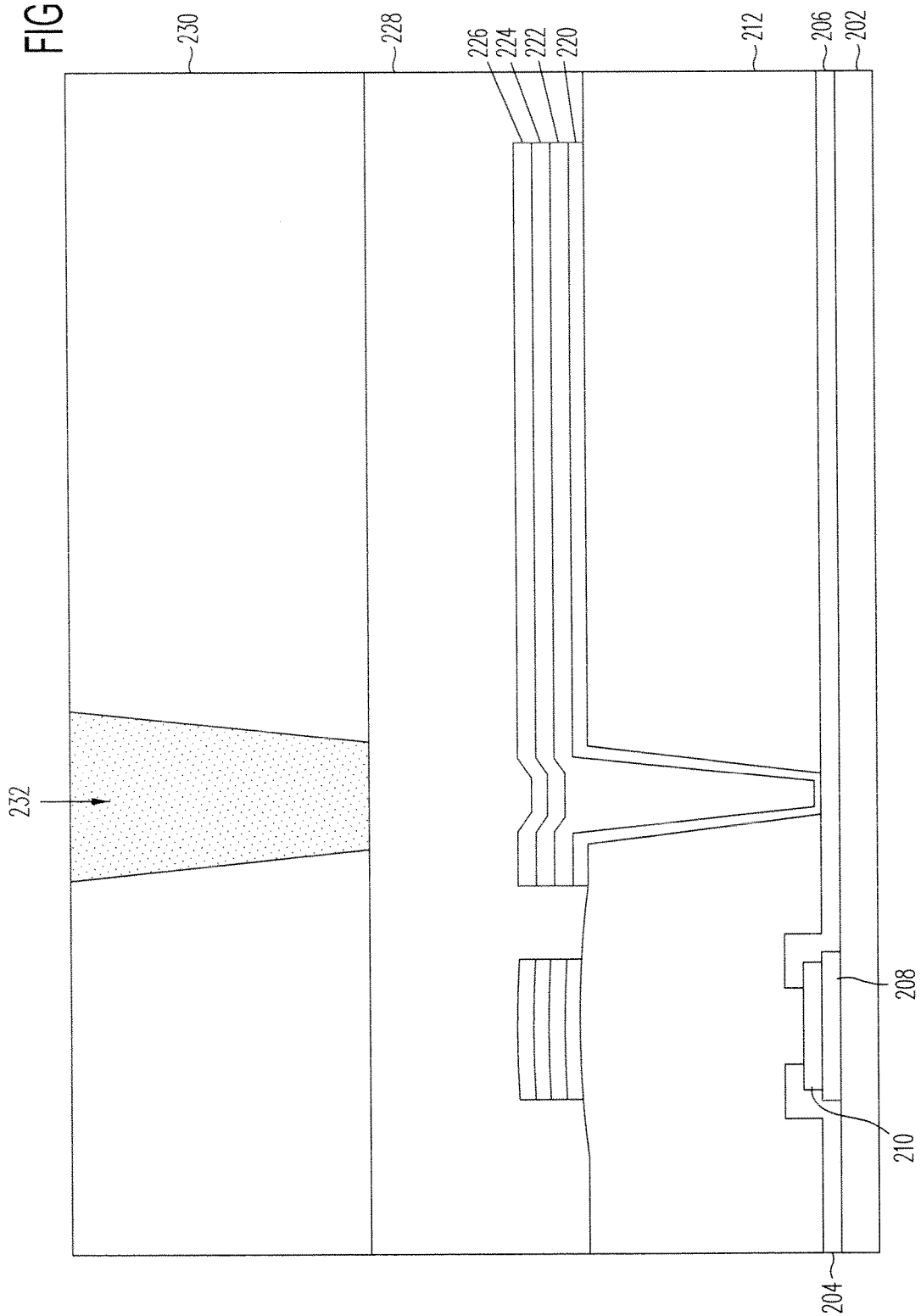

FIG. 22 shows the exposed pattern of the photoresist aye at location 232 for use in forming a via to metal layer 226.

Figure 23:
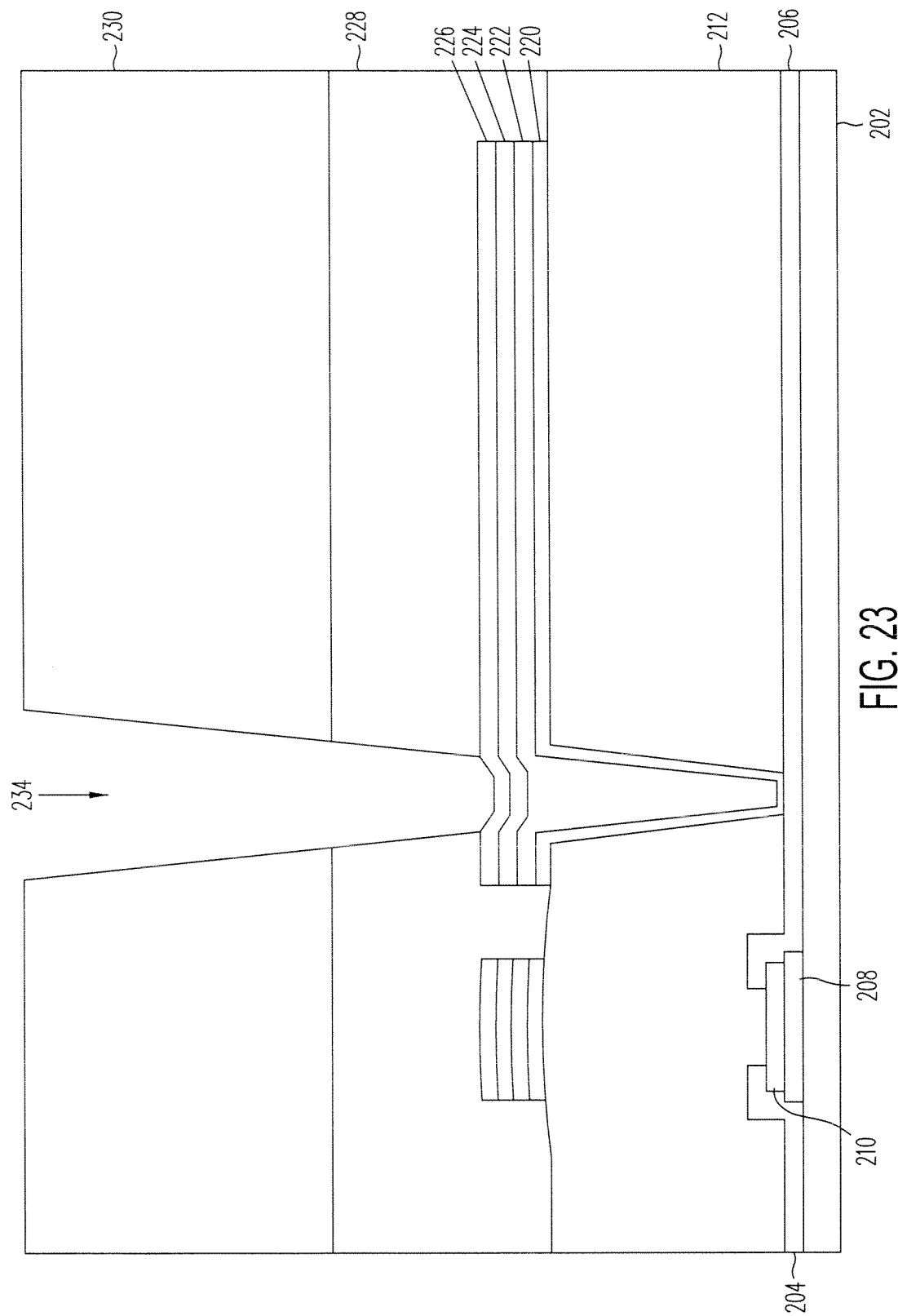

FIG. 23 shows the formation of a via 234 through the photoresist layer 230 and the ILD2 layer 228. The SiON (or other PECVD dielectric) of layer 228 is etched using either wet (HF type chemistry) or dry (F plasma; ideally CF4 or SF6). If the ILD2 layer 228 is deposited using a solution-based ILD, then the individual pixel wells are etched, using an F-containing (i.e. CF4, SF6, etc.) plasma process.

Figure 24:
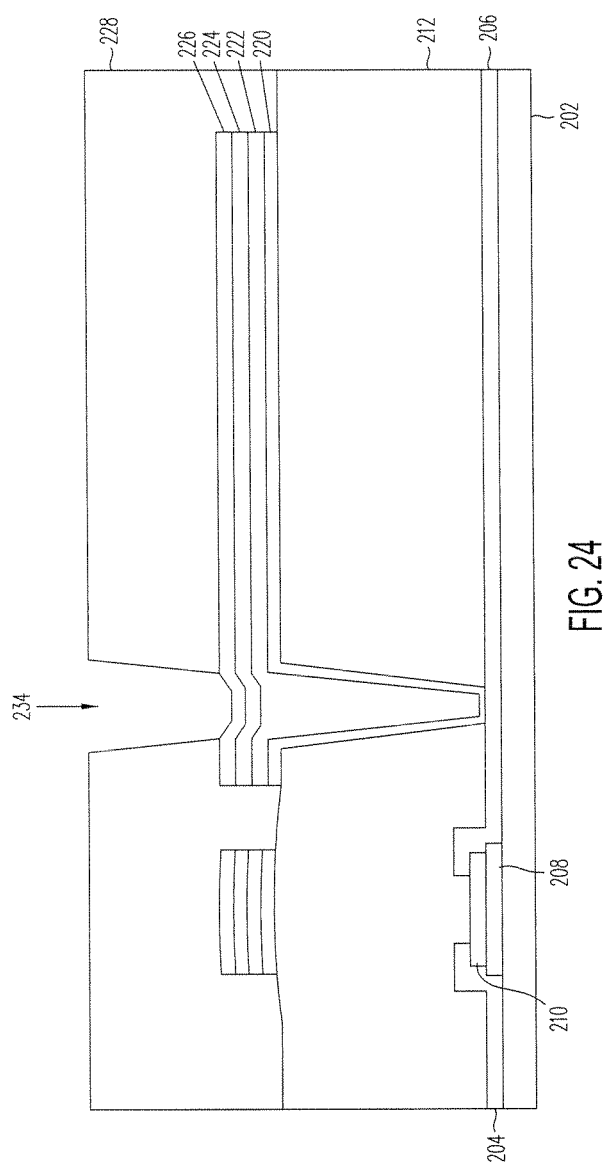

FIG. 24 shows the stripping of the photoresist layer 230 using materials and processes previously described. Once the ILD2 layer 228 is etched, the photoresist layer 230 is removed.

Figure 25:
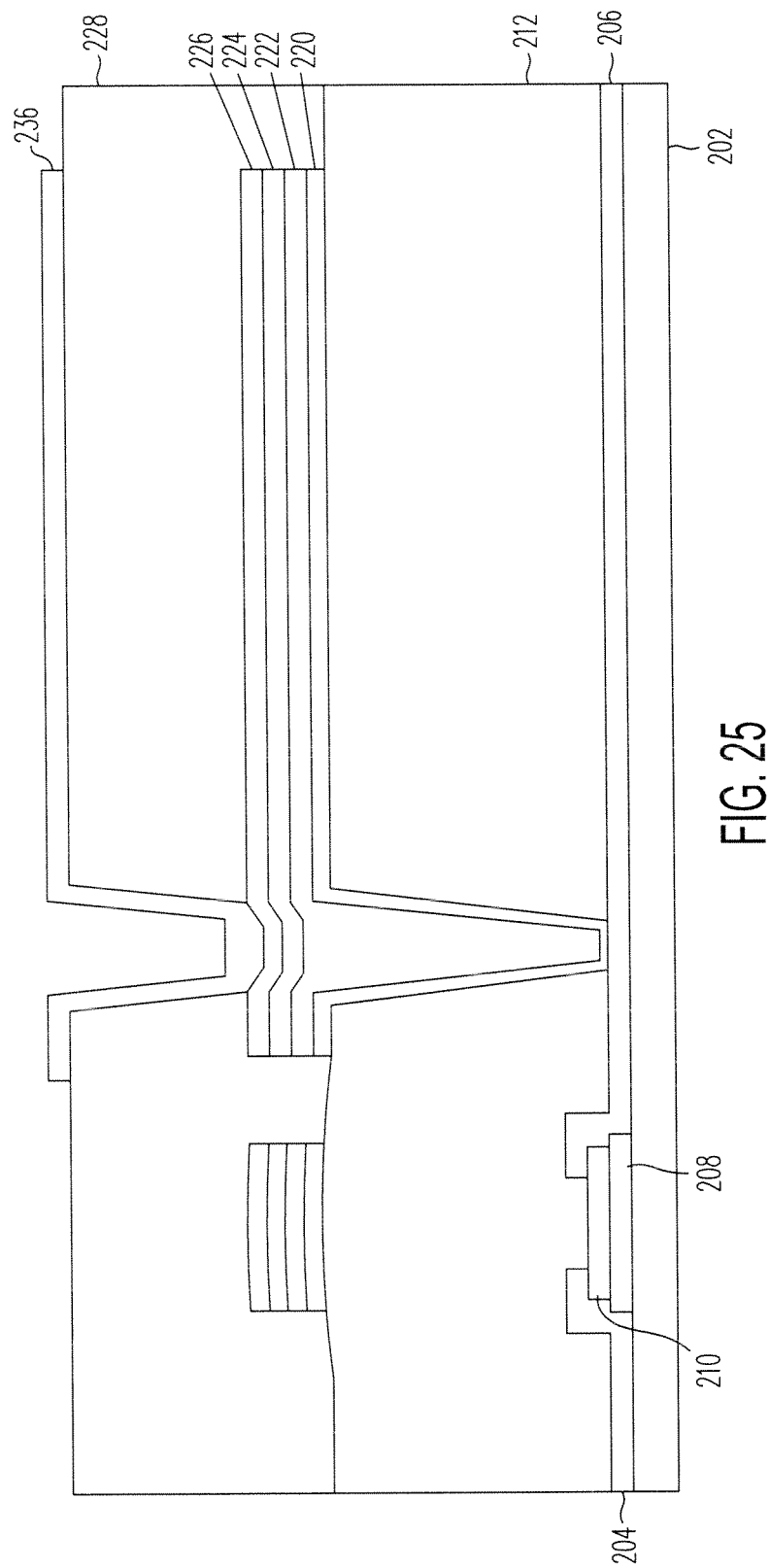

FIG. 25 shows the deposition of an ITO layer 236. The ITO layer 236 is deposited onto the ILD2 layer 228 and patterned using lithography. The ITO film layer 236 is etched using either wet (HF type chemistry) or dry (F plasma; ideally CF4 or SF6). Alternatively, the ITO layer 236 can be replaced with a conductive oxide, including but not limited to ITO, IGZO, IZO, ITZO, or AZO.

The method of the present invention can follow two paths from this point in the process. As previously described, a second method of the present invention is completed with reference to drawing FIGS. 26 to 29, and a third method of the present invention is completed with reference to drawing FIGS. 30 to 38.

Figure 26:
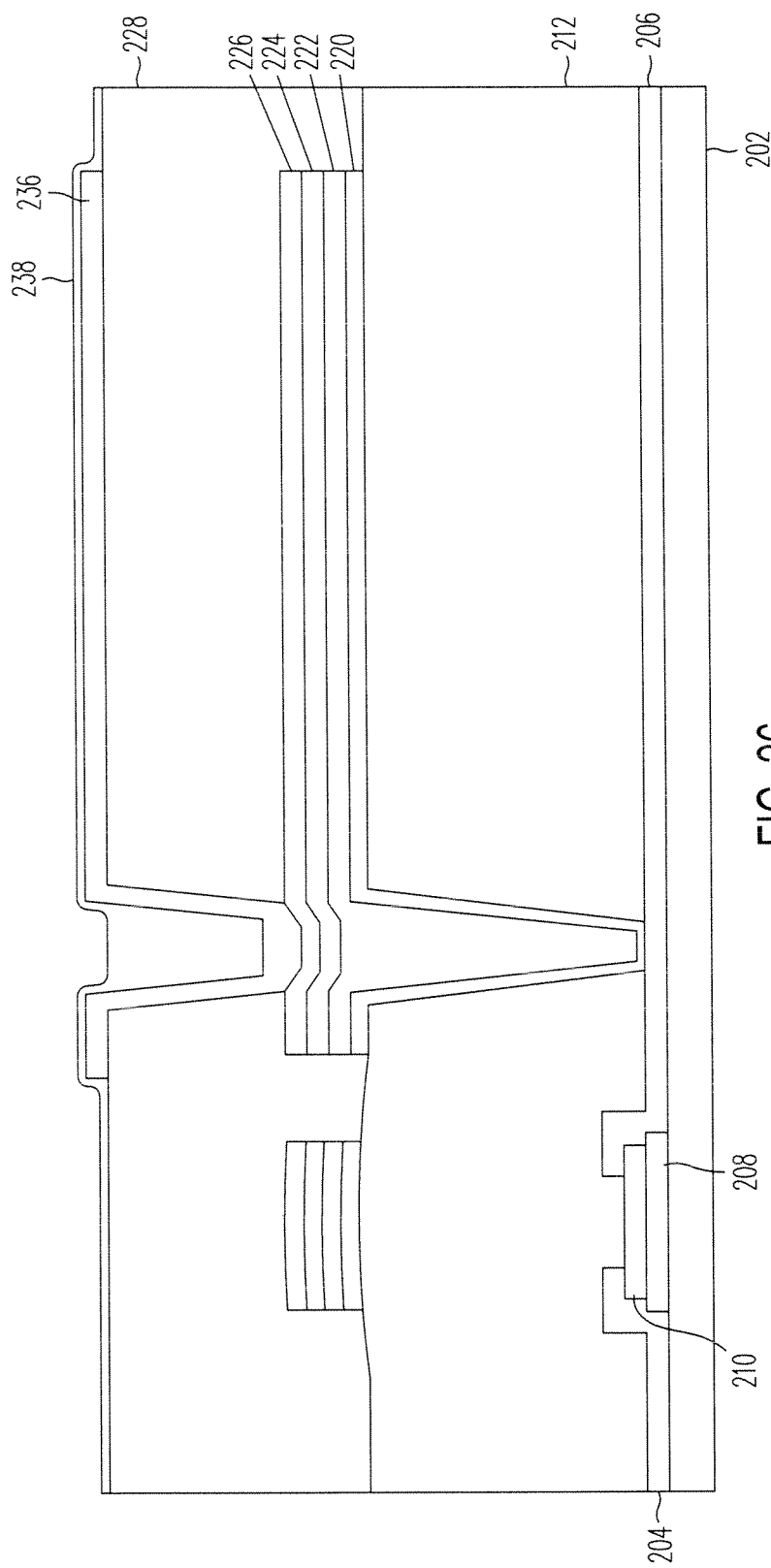
FIGS. 26-29 are sequential cross-sectional drawings of a method of manufacturing an image sensor device according to the second embodiment of the invention.

FIG. 26 shows the deposition of the ETL layer 238, using materials previously described. The ETL layer 238 is deposited onto each individual array. The material of ETL layer 238 can be applied by spin-coating, spray-coating or an inkjet process. The solution coats or fills, depending on the thickness deposited, each pixel well. Typical thicknesses range from 5 nm to 400 nm. The ETL layer 238 is then baked on a hot plate in a nitrogen environment for 5 to 20 minutes between temperatures of 100° C. to 130° C.

Figure 27:
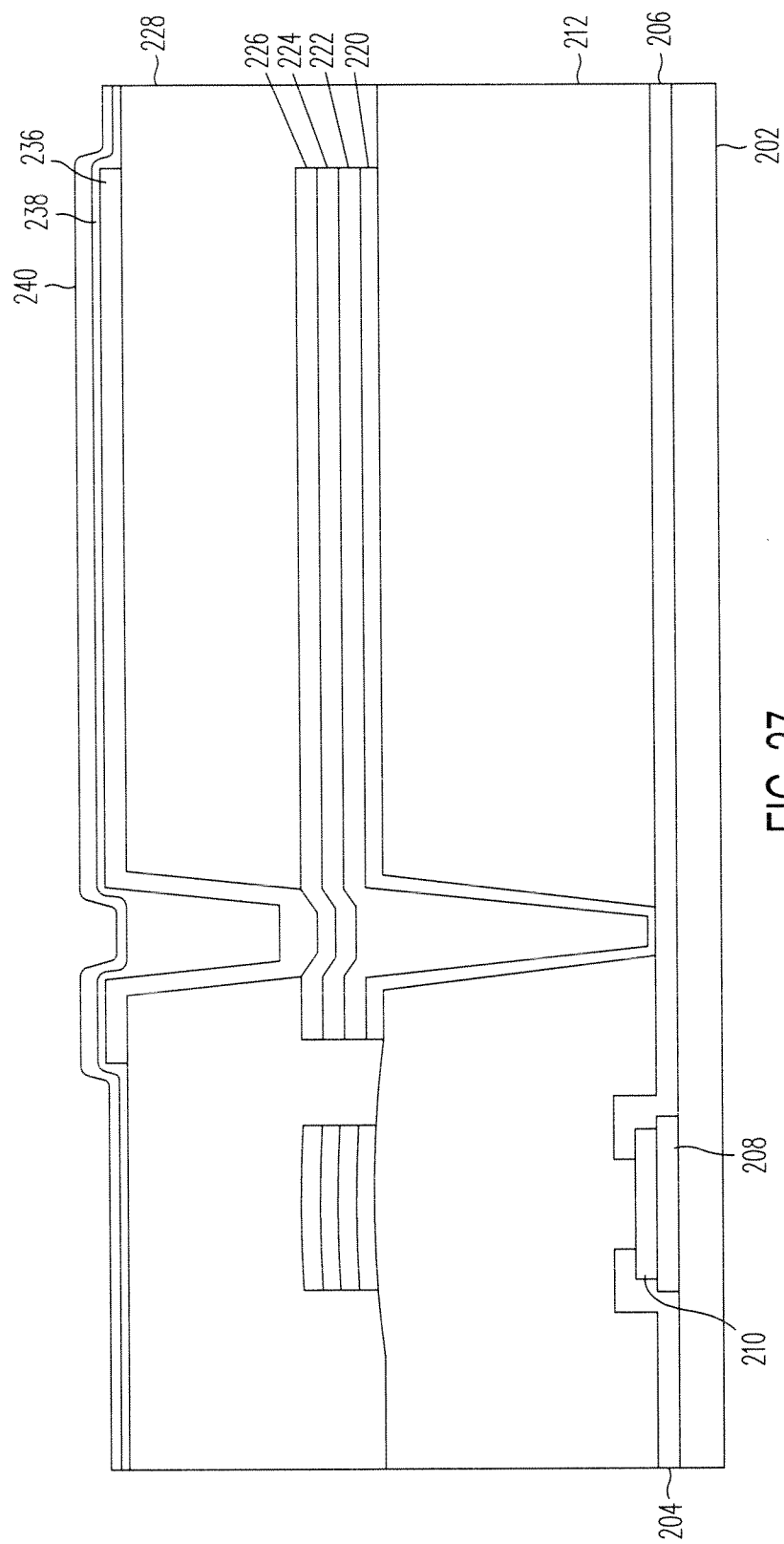

FIG. 27 shows the deposition of the BHJ layer 240, using materials previously described. The BHJ layer 240 is deposited onto the ETL layer 238. This material of BHJ layer 240 can be applied by screen printing, slot-die coating, spin-coating, spray coating or by inkjet. The solution coats or fills, depending on the thickness deposited, each pixel well. Typical thicknesses range from 100 nm to 1000 nm. The BHJ layer 240 is then baked initially for 2 to 8 minutes between 50° C. to 80° C. to drive the solvent out slowly. Afterwards, the BHJ layer 240 is baked in a nitrogen environment or in vacuum between 110° C. and 130° C. for 3 to 10 minutes.

Figure 28:
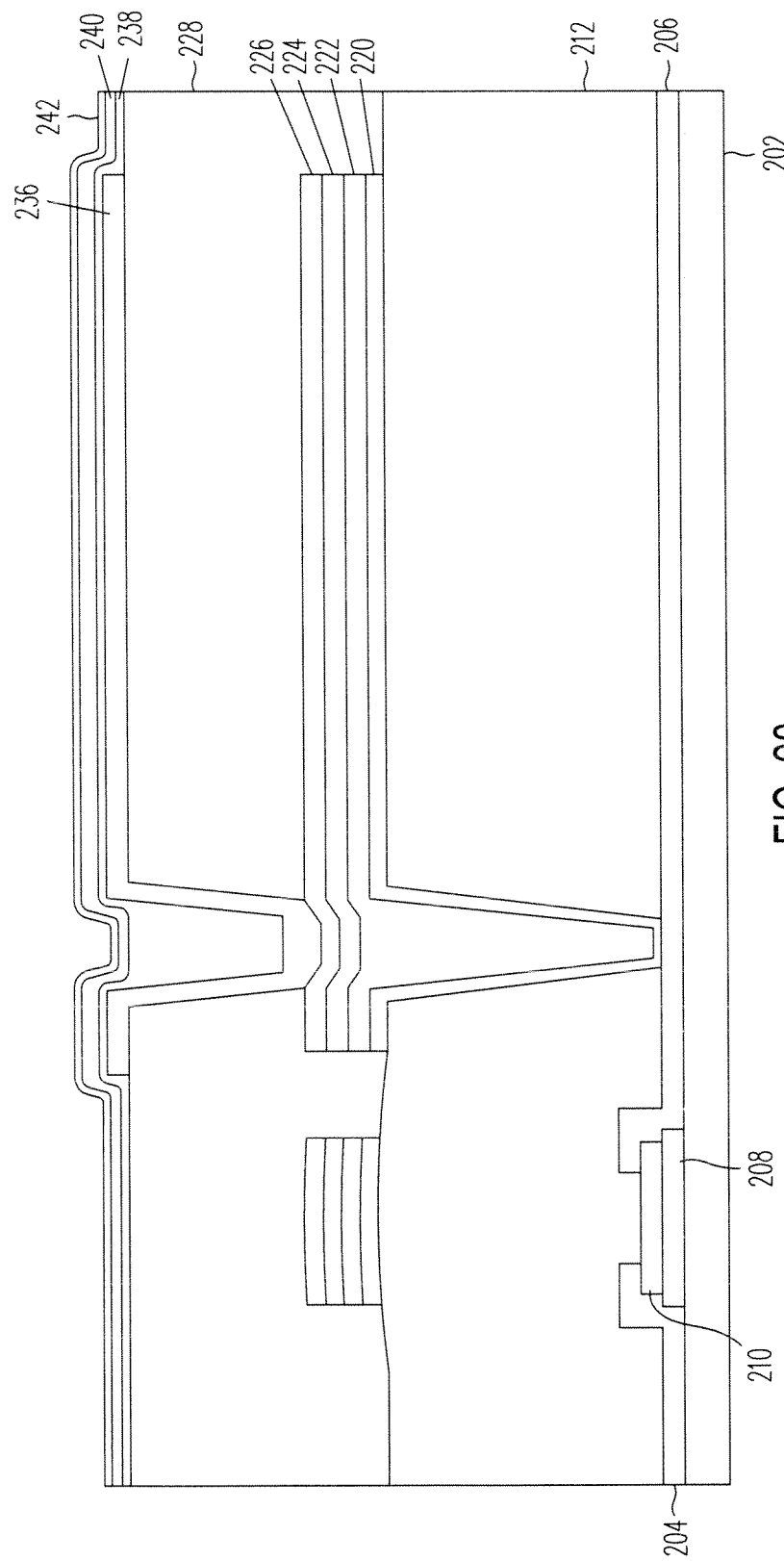

FIG. 28 shows the deposition of the HTL layer 242, using materials previously described. The HTL layer 242 is deposited onto the BHJ layer 240. This material of HTL layer 242 can be applied by spin-coating, spray-coating or an inkjet process. The solution coats or fills, depending on the thickness deposited, each pixel well. Typical thicknesses for layer 242 range from 5 nm to 400 nm. The HTL is then baked on a hot plate in a nitrogen environment for 5 to 20 minutes at a temperature between 100° C. to 130° C.

Figure 29:
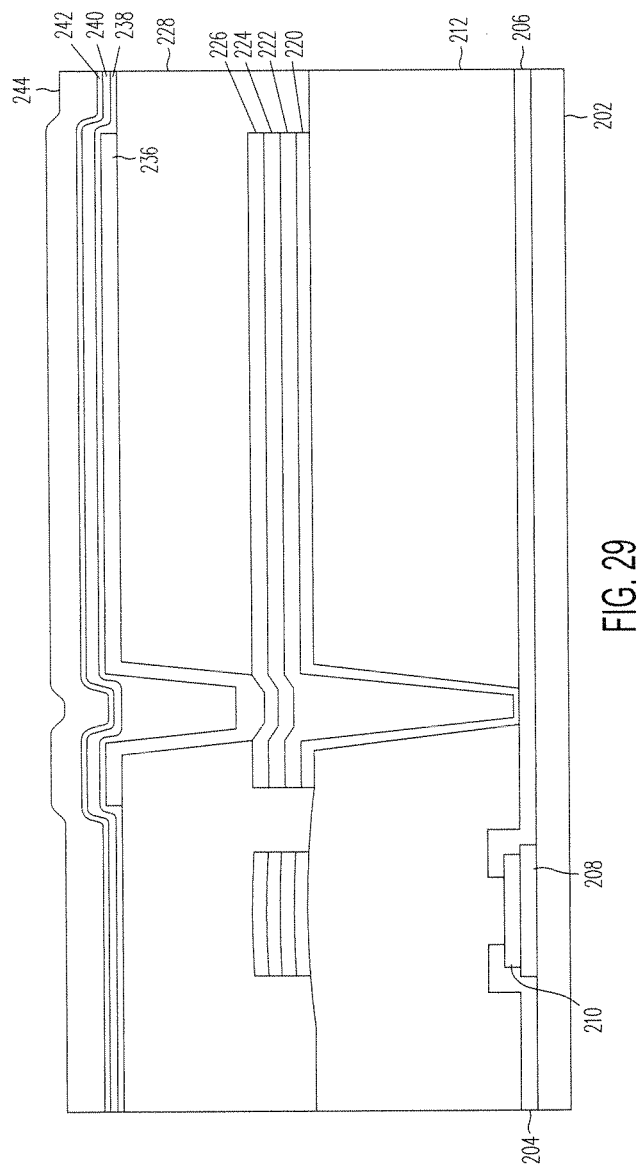

FIG. 29 shows the deposition of the TC layer 244, using materials previously described. The TC layer 244 is deposited onto the array by screen printing, slot-die coating, spin-coating, spray coating or by inkjet. The solution coats or fills, depending on the thickness deposited, each pixel well. Typical thicknesses range from 100 nm to 1000 nm. The TC layer 244 is then baked initially for 2 to 8 minutes between 50° C. to 80° C. to drive the solvent out slowly. Afterwards, the TC layer 244 is baked in a nitrogen environment or in vacuum between 110° C. and 130° C. for 3 to 10 minutes.

It is noted that a grid bias is applied to the top contact TC layer 244 and a clear passivation layer (not shown) can be applied as previously described.

The third embodiment of the OPD manufacturing process steps are now described, continuing in sequence from drawing FIG. 25.

Figure 30:
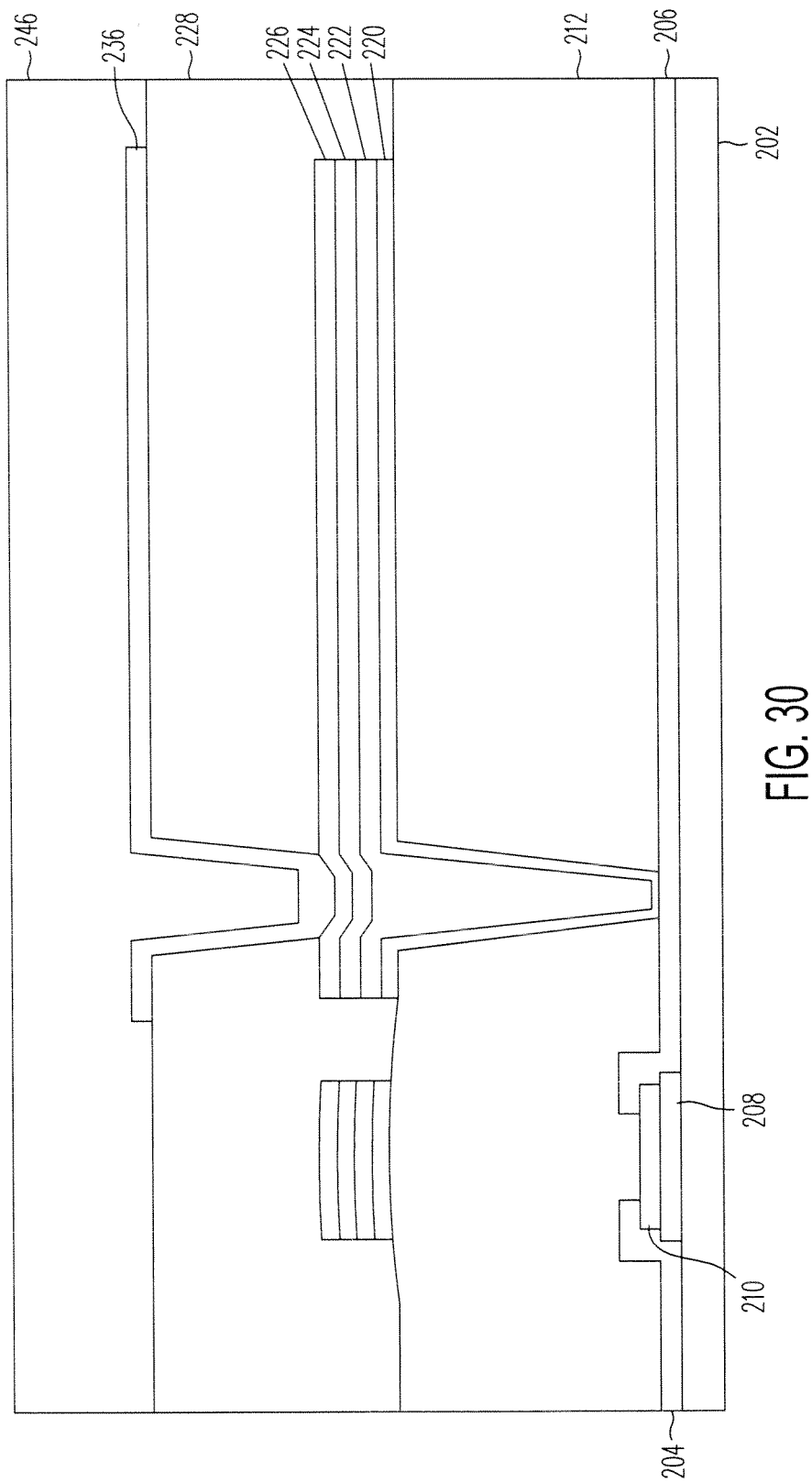
FIGS. 30-38 are sequential cross-sectional drawings of a method of manufacturing an image sensor device according to the third embodiment of the invention.

FIG. 30 shows the deposition of the bank layer 246. Deposition of the bank layer 246 on the ILD2 layer 228 uses a solution process (i.e. extrusion, slot die, spin coating, spray coating or inkjet). The ideal thickness of the bank layer is between 1.0 um to 6.0 um. The bank layer 246 is deposited at ambient temperature followed by a soft bake (to remove solvents) at T=50° C. to 100° C. The bank layer 246 materials may include, but are not limited to, Dow Chemical Cyclotene 6100 series (or variants thereof), Honeywell PTS series, Microchem SU-8. TOK TPIR PN-0371D or other resin materials known in the art. The bank layer 246 material provides excellent planarization (>90%) over the entire substrate.

Figure 31:
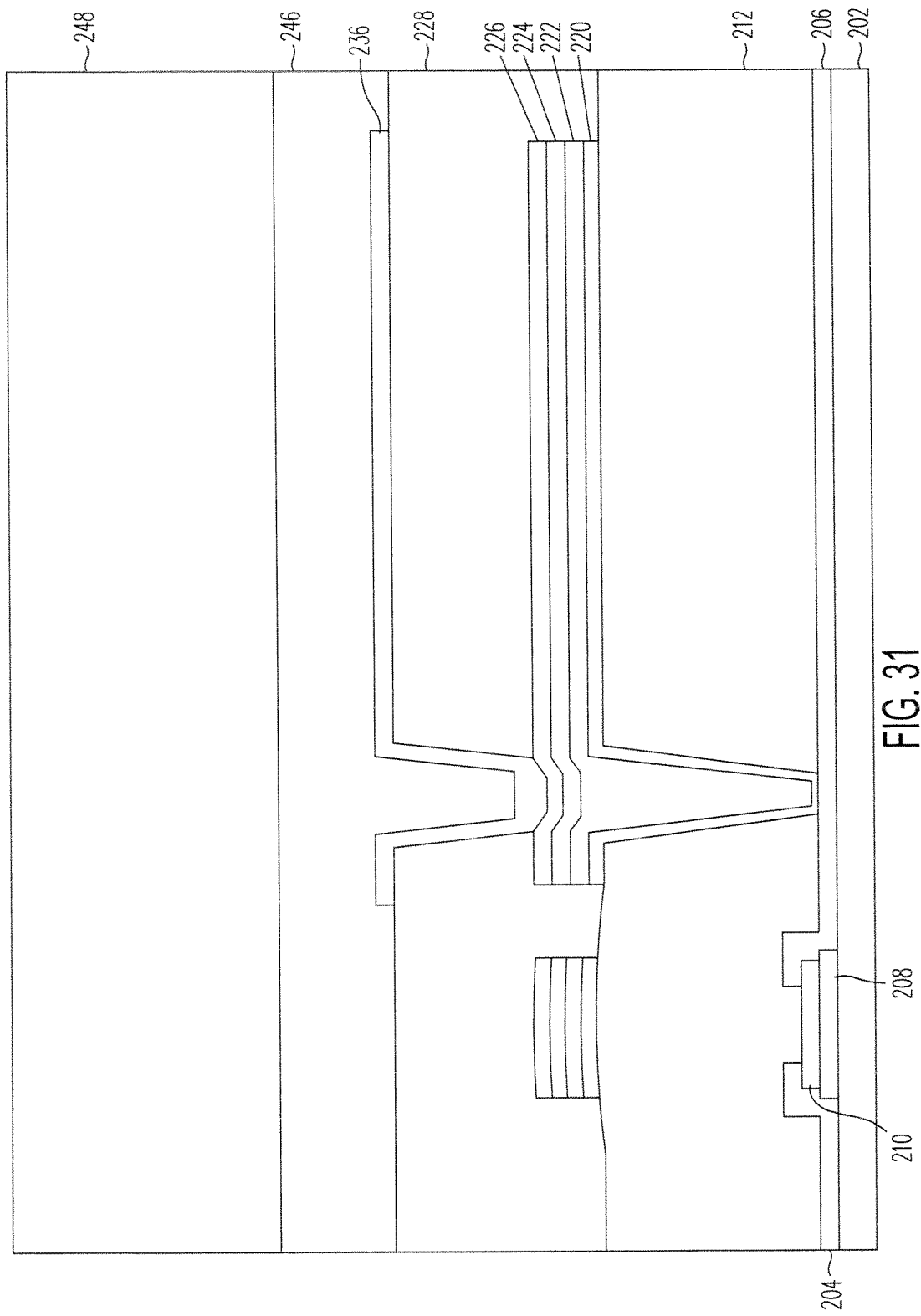

FIG. 31 shows the deposition of the photoresist layer 248, using materials and methods previously described. The bank layer material 246 is cured (T=200° C. to 300° C.; ideally less than 250° C.) in an N2 atmosphere for 1 to 6 hours followed by coating with the photoresist layer 248.

Figure 32:
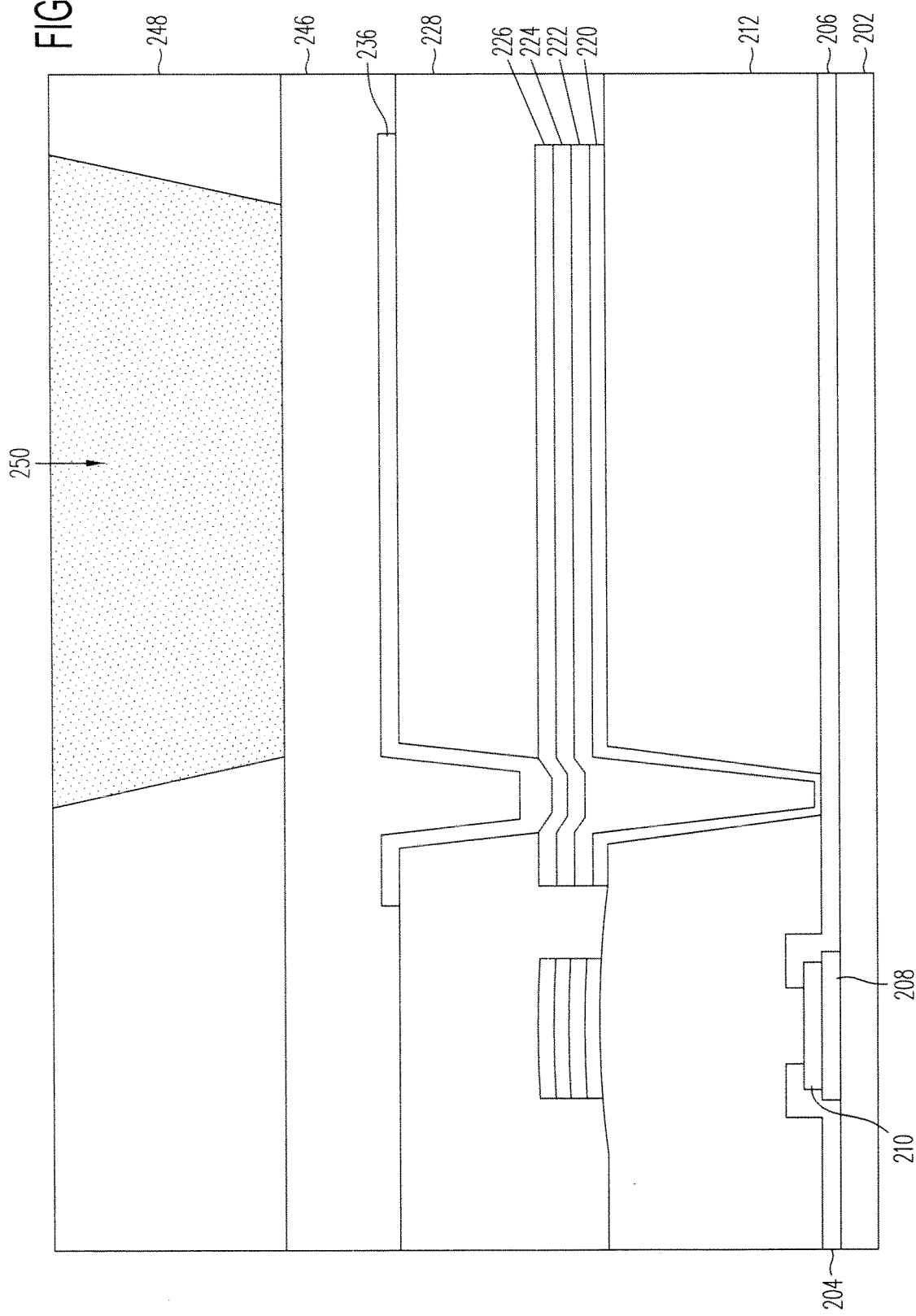

FIG. 32 shows the patterning of the photoresist layer 248 at location 250. Photoresist layer 248 is patterned by i-line exposure and developed to form individual pixel wells down to the bank layer 246. Typical dose range is 75 mJ to 200 mJ (ideally 90 to 125 mJ) and a thickness of photoresist layer 248 is between 1.0 um to 10.0 um, ideally 2.0 um to 5.0 um.

Figure 33:
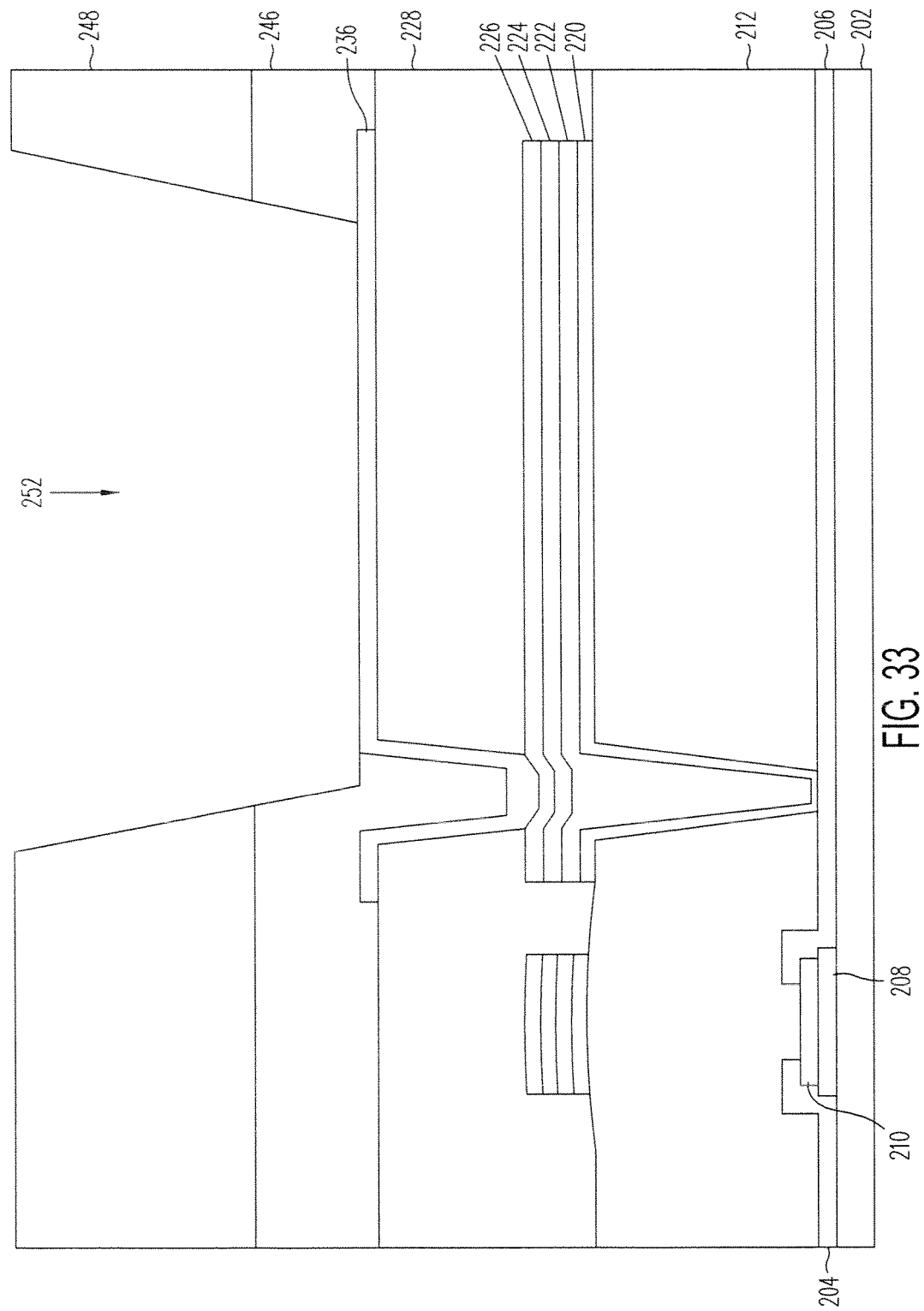

FIG. 33 shows the via 252 etched through the photoresist layer 248 and the bank layer 246. Following inspection, the individual pixel wells 252 are etched, using an F-containing (i.e. CF4, SF6, etc.) plasma process, into the bank layer 246 to the surface of the ITO layer 236.

Figure 34:
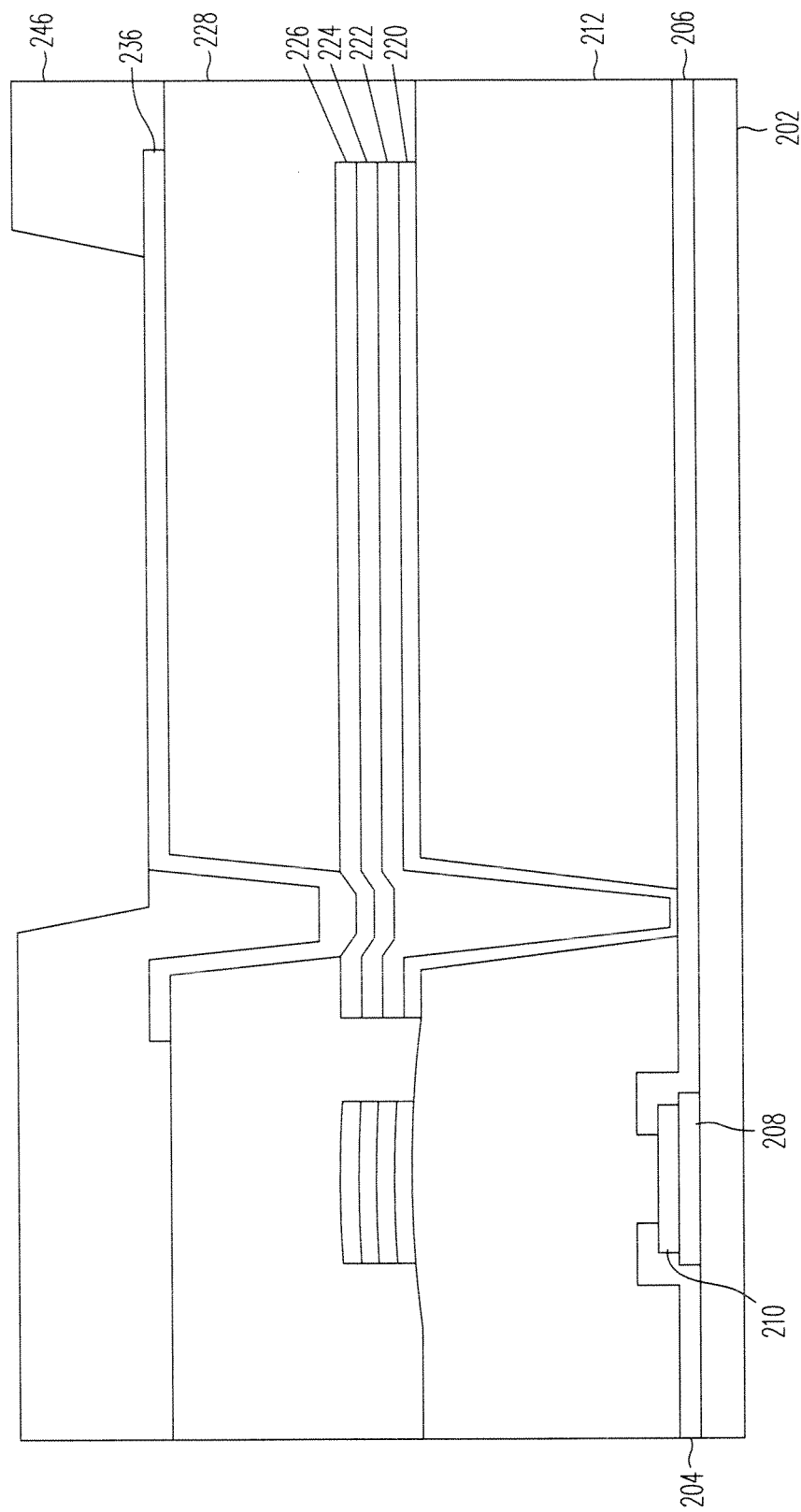

FIG. 34 shows the stripping of the photoresist layer 248. The photoresist layer 248 is stripped using the PRS-2000 stripper or other such materials. The bank layer 246 material is immune to the strip chemistry and remains as part of device. Following the strip process, the individual pixel wells are formed to create the organic photodiode. It is also worth noting that the bank material is highly planar, thus providing excellent dielectric separation between each pixel.

Figure 35:
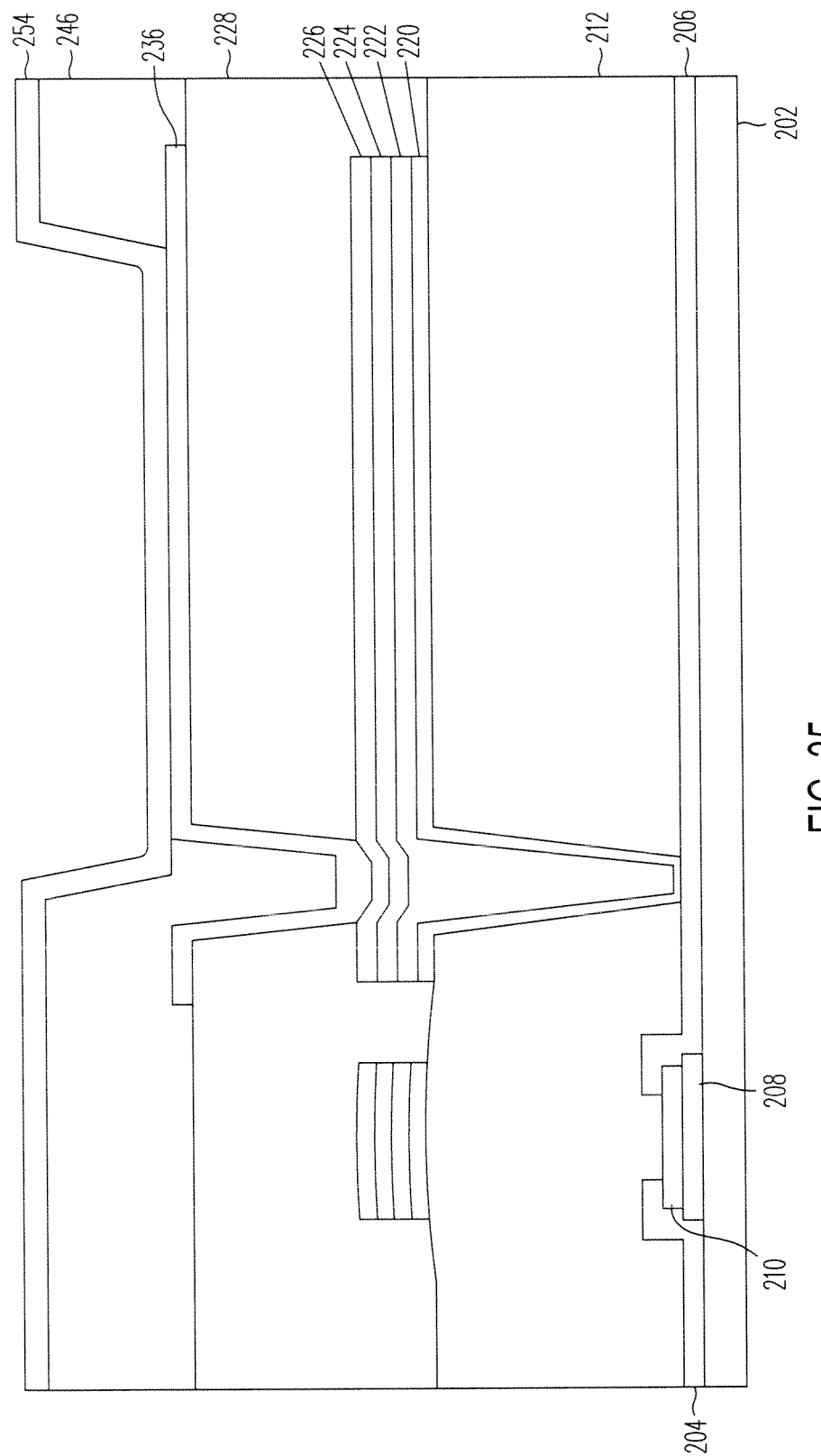

FIG. 35 shows the deposition of the ETL layer 254, using materials previously described. The ETL layer 254 is deposited onto the array by spin-coating, spray-coating or an inkjet process. The solution coats or fills, depending on the layer thickness, each pixel well. Typical thicknesses range from 5 nm to 400 nm. The ETL layer 254 is then baked on a hot plate in a nitrogen environment for 5-20 minutes between 100° C. to 130° C.

Figure 36:
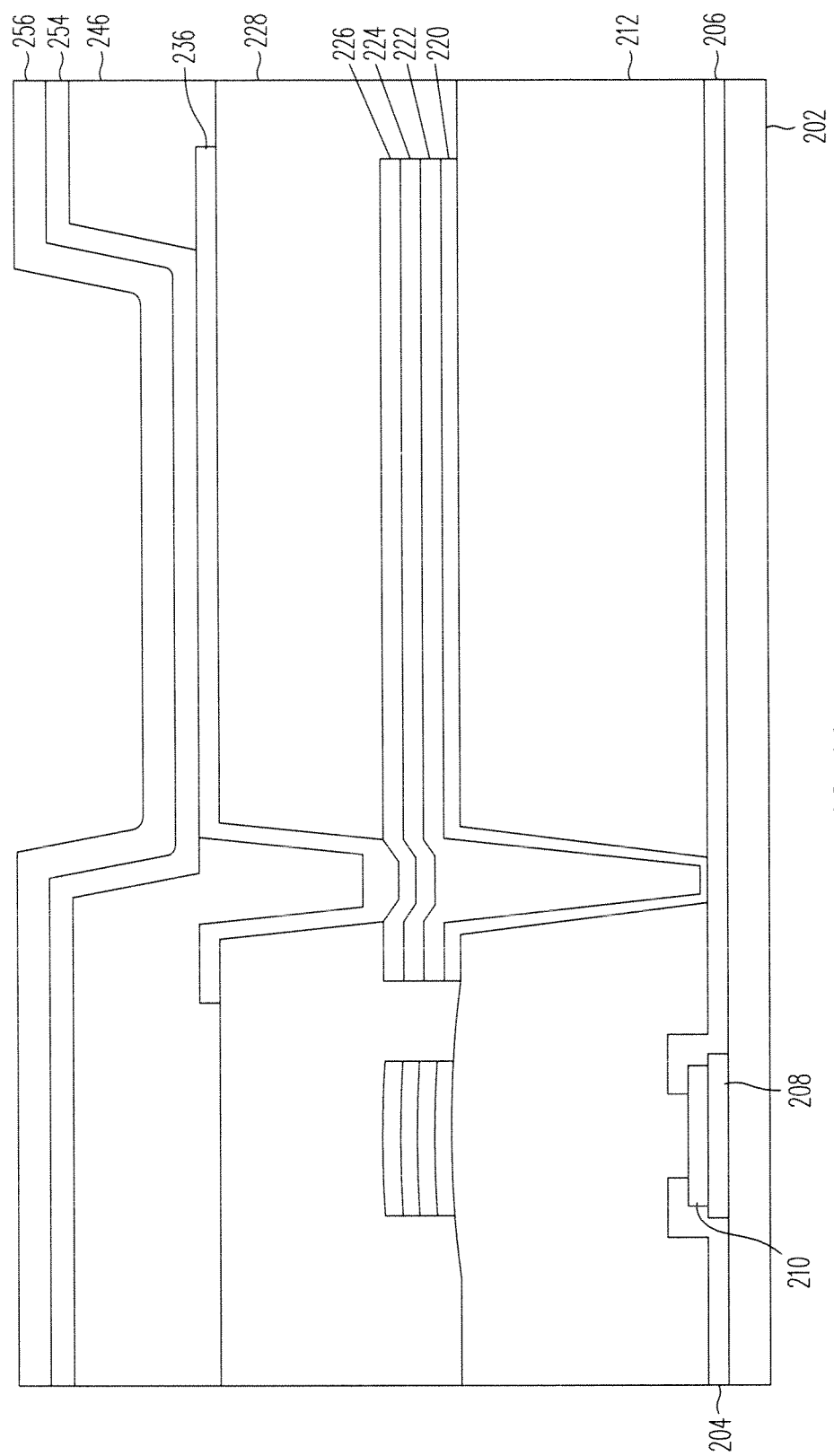

FIG. 36 shows the deposition of the BHJ layer 256, using materials previously described. The BHJ layer 256 is deposited onto the ETL layer 254 by screen printing, slot-die coating, spin-coating, spray coating or by inkjet. The solution coats or fills, depending on the layer thickness, each pixel Nell. Typical thicknesses range from 100 nm to 1000 nm. The BHJ layer 256 is then baked initially for 2 to 8 minutes between temperatures of 50° C. to 80° C. to drive the solvent out slowly. Afterwards, the BHJ layer 256 is baked in a nitrogen environment or in a vacuum between temperatures of 110° C. and 130° C. for 3 to 10 minutes.

Figure 37:
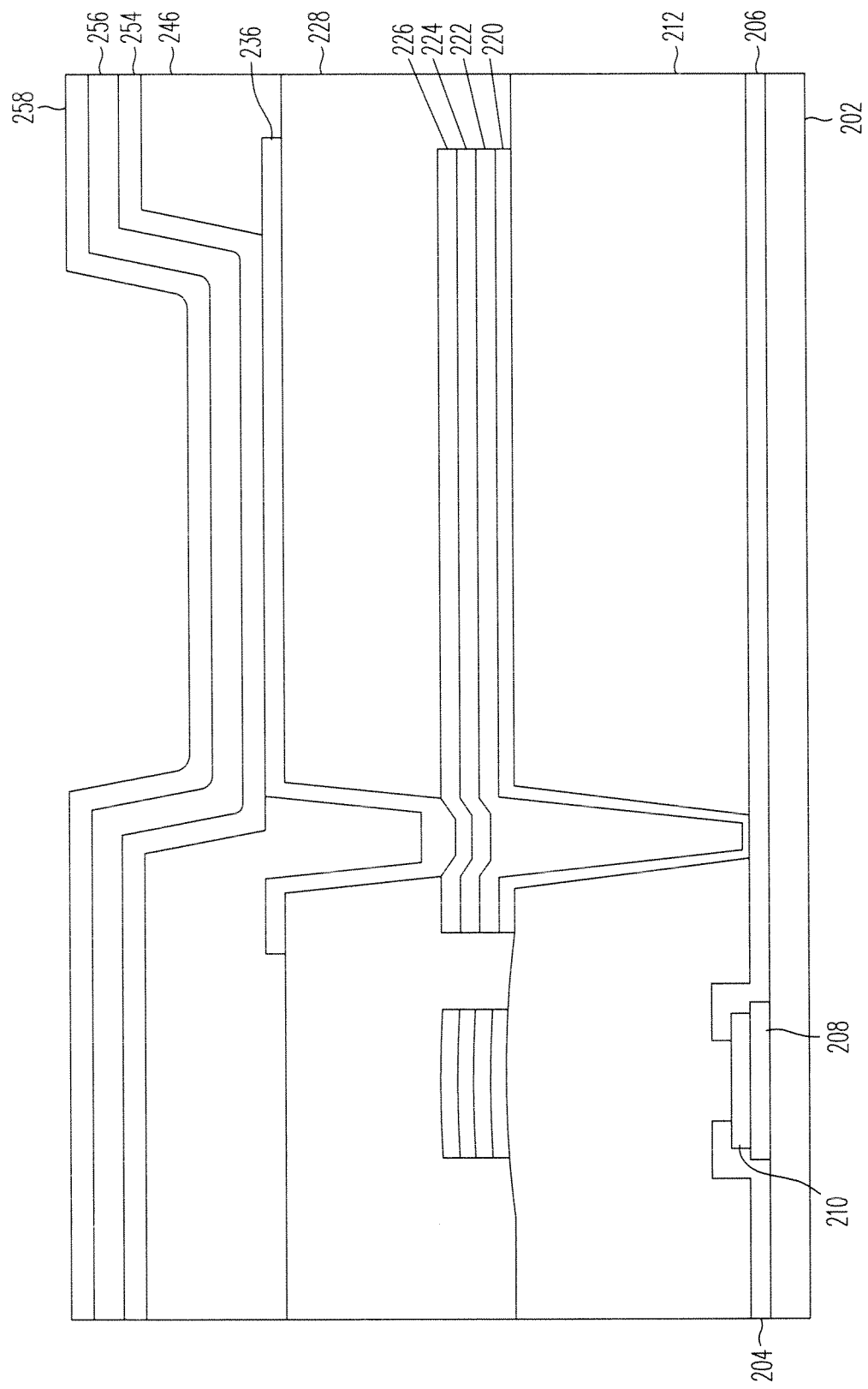

FIG. 37 shows the deposition of the HTL layer 258, using materials previously described. The HTL layer 258 is deposited onto the BHJ layer by spin-coating, spray-coating or an inkjet process. The solution coats or fills, depending on the layer thickness, each pixel well. Typical thicknesses range from 5 nm to 400 nm. The ETL is then baked on a hot plate in a nitrogen environment for 5 to 20 minutes between temperatures of 100° C. to 130° C.

Figure 38:
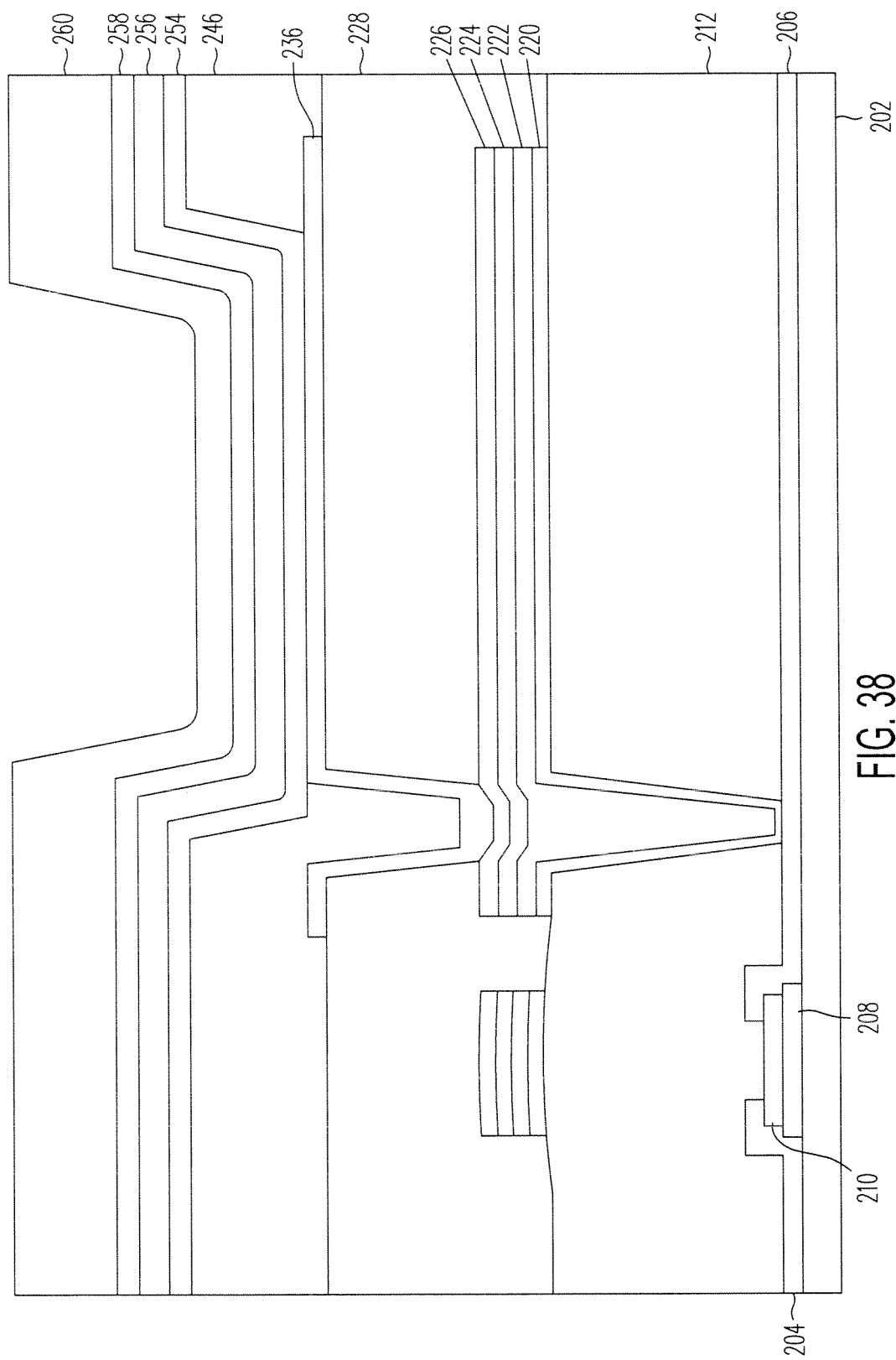

FIG. 38 shows the deposition of the TC layer 260, using materials previously described. The TC layer 260 is deposited onto the array by screen printing, slot-die coating, spin-coating, spray coating or by inkjet. The solution coats or fills, depending on the thickness deposited, each pixel well. Typical thicknesses range from 100 nm to 1000 nm. The TC layer 260 is then baked initially for 2 to 8 minutes between 50° C. to 80° C. to drive the solvent out slowly. Afterwards, the TC layer 260 is baked in a nitrogen environment or in vacuum between temperatures of 110° C. and 130° C. for 3 to 10 minutes.

It is noted that a grid bias is applied to the top contact TC layer 260 and a clear passivation layer (not shown) can be applied as has been previously described.

PARTS LIST

102 glass or plastic substrate
104 metal line
106 metal line
108 gate
110 island
112 ILD layer
114 photoresist layer
116 photoresist layer exposed portion
118 via
120 TiW layer 122 Al layer
124 TiW layer
126 ITO layer
128 Bank layer
130 photoresist layer
132 photoresist layer exposed portion
134 via
136 ETL layer
138 BHJ layer
140 HTL layer
142 TC layer
202 glass or plastic substrate
204 metal line
206 metal line
208 gate
210 island
212 ILD layer
214 photoresist layer
216 photoresist layer exposed portion
218 via
220 TiW layer
222 Al layer
224 TiW layer
226 ITO layer
228 ILD 2 layer
230 photoresist layer
232 photoresist layer exposed portion
234 via
236 ITO layer
238 ETL layer
240 BHJ layer
242 HTL layer
244 TC layer
246 Bank layer
248 photoresist layer
250 photoresist layer exposed portion
252 via
254 ETL layer
256 BHJ layer
258 HTL layer
260 TC layer While the inventive concept of the present invention has been shown and described in connection with several embodiments, it will be apparent to those skilled in the art that modifications and variations could be made without departing from the spirit and scope of the present inventive concept as defined by the appended claims.

We claim:

1. A method of manufacturing an image sensor device comprising:
   providing a metalized thin film transistor layer form on a glass substrate;
   forming a first inter-layer dielectric layer on the metalized thin film transistor layer;
   forming a via through the first inter-layer dielectric layer;
   forming a metal layer on an upper surface of the first inter-layer dielectric and within the first inter-layer dielectric layer via for contacting the metalized thin film transistor layer;
   forming a second inter-layer dielectric layer on an upper surface of the metal layer and the first inter-layer dielectric layer;
   forming a via through the second inter-layer dielectric layer;
   forming a conductive oxide layer on an upper surface of the second inter-layer dielectric layer and within the second inter-layer dielectric layer via for contacting an upper surface of the metal layer;
   forming an electron transport layer on an upper surface of the second inter-layer dielectric layer and the conductive oxide layer;
   forming a bulk heterojunction layer on an upper surface of the electron transport layer;
   forming a hole transport layer on an upper surface of the bulk heterojunction layer; and
   forming a top contact layer on an upper surface of the hole transport layer.

2. The method of claim 1, wherein the first and second inter-layer dielectric layers each comprise a SiON, $Si_{O2}$, or SiN layer.

3. The method of claim 1, wherein the metal layer comprises a quad-layer metal stack layer.

4. The method of claim 1, wherein the conductive oxide layer comprises an ITO, IGZO, IZO, ITZO, or AZO layer.

5. The method of claim 1, wherein the electron transport layer comprises a work function tuning layer.

6. The method of claim 1, wherein the bulk heterojunction layer comprises a photoactive layer.

7. The method of claim 1, wherein the hole transport layer comprises a work function tuning layer.

8. The method of claim 1, wherein the top contact layer comprises an anode layer.

9. A method of manufacturing an image sensor device comprising:
   providing a metalized thin film transistor layer form on a glass substrate;
   forming a first inter-layer dielectric layer on the metalized thin film transistor layer;
   forming a via through the first inter-layer dielectric layer;
   forming a metal layer on an upper surface of the first inter-layer dielectric and within the first inter-layer dielectric layer via for contacting the metalized thin film transistor layer;
   forming a second inter-layer dielectric layer on an upper surface of the metal layer and the first inter-layer dielectric layer;
   forming a via through the second inter-layer dielectric layer;
   forming a conductive oxide layer on an upper surface of the second inter-layer dielectric layer and within the second inter-layer dielectric layer via for contacting an upper surface of the metal layer:
   forming a bank layer on an upper surface of the second inter-layer dielectric layer and the conductive oxide layer;
   forming a via through the bank layer;
   forming an electron transport layer on an upper surface of the bank layer and within the bank layer via to contact an upper surface of the conductive oxide layer;
   forming a bulk heterojunction layer on an upper surface of the electron transport layer:
   forming a hole transport layer on an upper surface of the bulk heterojunction layer; and
   forming a top contact layer on an upper surface of the hole transport layer.

10. The method of claim 9, wherein the first and second inter-layer dielectric layers each comprise a SiON, $Si_{O2}$, or SiN layer.

11. The method of claim 9, wherein the metal layer comprises a quad-layer metal stack layer.

12. The method of claim 9, wherein the conductive oxide layer comprises an ITO, IGZO, IZO, ITZO, or AZO layer.

13. The method of claim 9, wherein the bank layer comprises a resin layer.

14. The method of claim 9, wherein the electron transport layer comprises a work function tuning layer.

15. The method of claim 9, wherein the bulk heterojunction layer comprises a photoactive layer.

16. The method of claim 9, wherein the hole transport layer comprises a work function tuning layer.

17. The method of claim 9, wherein the top contact layer comprises an anode layer.

* * * * *